United States Patent [19]
Sawai et al.

[11] Patent Number: 5,801,559
[45] Date of Patent: Sep. 1, 1998

[54] CLOCK GENERATING CIRCUIT, PLL CIRCUIT, SEMICONDUCTOR DEVICE, AND METHODS FOR DESIGNING AND MAKING THE CLOCK GENERATING CIRCUIT

[75] Inventors: Katsunori Sawai; Yukihiko Shimazu, both of Tokyo, Japan

[73] Assignee: Mitsubishi Denki Kabushiki Kaisha, Tokyo, Japan

[21] Appl. No.: 588,934

[22] Filed: Jan. 19, 1996

[30] Foreign Application Priority Data

Sep. 6, 1995 [JP] Japan .................. 7-229453

[51] Int. Cl.⁶ .................................................. H03L 7/00
[52] U.S. Cl. .................... 327/116; 327/149; 327/158; 327/244; 327/270; 327/276
[58] Field of Search ................ 327/113–117, 119–122, 327/261, 262, 264, 265, 269, 270, 273, 276, 278, 279, 281, 147, 149, 150, 156, 158, 159, 161, 163, 237, 243–245; 377/47, 48

[56] References Cited

U.S. PATENT DOCUMENTS

| | | | |
|---|---|---|---|
| 4,496,861 | 1/1985 | Bazes | 327/176 |
| 4,789,996 | 12/1988 | Butcher | 327/158 |
| 4,837,643 | 6/1989 | Tierney, III | 327/147 |
| 4,905,192 | 2/1990 | Nogami et al. | 327/276 |
| 5,006,979 | 4/1991 | Yoshie et al. | |
| 5,260,608 | 11/1993 | Marbot | 327/113 |
| 5,376,829 | 12/1994 | Rogers et al. | 327/408 |
| 5,389,843 | 2/1995 | Mckinney | 327/276 |
| 5,422,835 | 6/1995 | Houle et al. | |
| 5,446,867 | 8/1995 | Young et al. | |
| 5,463,337 | 10/1995 | Leonowich | 327/113 |
| 5,491,673 | 2/1996 | Okayasu | 327/158 |
| 5,514,990 | 5/1996 | Mukaine et al. | 327/116 |
| 5,530,387 | 6/1996 | Kim | 327/119 |

FOREIGN PATENT DOCUMENTS

| | | | |
|---|---|---|---|
| 63-207213 | 8/1988 | Japan | 327/278 |
| 63-286020 | 11/1988 | Japan | 327/278 |
| 2-288724 | 11/1990 | Japan | 327/269 |
| 3-198417 | 8/1991 | Japan | 327/278 |
| 5-129907 | 5/1993 | Japan | 327/278 |

OTHER PUBLICATIONS

A. Efendovich et al., "Multifrequency Zero–Jitter Delay––Locked Loop", *IEEE Journal of Solid–State Circuits*, vol. 29, No. 1, Jan. 1994, pp. 67–70.

M. Izumikawa et al., "WP 5.4: A 0.9V 100 MHz 4mW 2 mm² 16b DSP Core", *IEEE International Solid–State Circuits Conf.*, Digest Of Technical Papers, pp. 84, 85.

IBM Technical Disclosure Bulletin, vol. 26, No. 3A, Frequency Multiplier Using Delay, Aug. 1983.

*Primary Examiner*—Timothy P. Callahan
*Assistant Examiner*—T. T. Lam
*Attorney, Agent, or Firm*—Burns, Doane, Swecker & Mathis, LLP

[57] ABSTRACT

A clock generating circuit includes a plurality of delay lines connected in cascade, each delay line including two switching elements for letting in or shutting out a clock, and a delay element connected to each of the switching elements. A PLL circuit and a semiconductor device both include the clock generating circuit. The number K of the delay units in each of the delay lines of the clock generating circuit is calculated from:

$$K > \{\{1/(2 \cdot N \cdot F_{ref})\} - (T_{read})\}/(T_{delay})$$

10 Claims, 32 Drawing Sheets

5,801,559

1

CLOCK GENERATING CIRCUIT, PLL CIRCUIT, SEMICONDUCTOR DEVICE, AND METHODS FOR DESIGNING AND MAKING THE CLOCK GENERATING CIRCUIT

BACKGROUND OF THE INVENTION

1. Field of the Invention

The present invention relates to a clock generating circuit, PLL (phase lock loop) circuit, a semiconductor device and methods for designing and making the clock generating circuit.

2. Description of Related Art

In microprocessors, a high frequency clock is used to increase the operating speed. A high frequency exceeding 100 MHz is not uncommon. However, a high frequency clock is difficult to transmit on a printed substrate, and is susceptible to electromagnetic wave due to the transmission of signals. To solve these problems, a semiconductor chip is supplied with a low-frequency clock from the outside, and a PLL circuit is used in the microprocessor, so that a high frequency clock is obtained by multiplying the frequency of the clock within the semiconductor chip.

On the other hand, an operating voltage applied to a microprocessor tends to be low. To produce a clock having a high frequency exceeding 100 HMz by a widely used analog PLL circuit, a large-gain VCO (voltage control oscillator) is required. However, the operation of the large gain VCO is likely to be unstable owing to noise superposed on the control voltage. To reduce the noise, a large capacitor is required. A large capacitor having a large area must be integrated on the semiconductor chip or alternatively the capacitor must be connected outside. In either case, the size of the clock generating circuit becomes large.

There is a clock generating circuit which is provided with a digital PLL circuit in place of the analog PLL circuit.

FIG. 1 is a block diagram of a clock generating circuit using a digital PLL circuit. A clock $CLK_{in}$ is successively transmitted from delay lines DL1, DL2 and DL3 connected in cascade. The pulse generating circuit PG is composed of three EXOR circuits $E0_1$, $E0_2$ and $E0_3$. The input clock CLA and output clock CLB of the delay line DL1 are inputted to the respective input terminals of the EXOR circuit $E0_1$. The output clock of the delay line DL2, that is, the input clock CLC of the delay line DL3, and output clock CLD of the delay line DL3 are inputted to the respective input terminals of the EXOR circuit $E0_2$. The output clocks of the EXOR circuits $E0_1$ and $E0_2$ are inputted to the respective input terminals of the EXOR circuit $E0_3$. A clock $CLK_{out}$ having a multiplied frequency is outputted from the EXOR circuit $E0_3$.

Referring to FIG. 2, which shows a timing chart of a clock from each component, the operation of the clock generating circuit will be described. When the clock $CLK_{in}$ is inputted to a delay line DL1, it is successively transmitted through the delay lines DL1, DL2 and DL3 at each of which it is delayed. As shown in FIG. 2, when the clocks CLA, CLB, CLC and CLD gradually delayed are inputted to the pulse generating circuit PG, the clock $CLK_{out}$ is inverted in the level every when one of the clocks CLA, CLB CLC and CLD is inverted from H-level to L-level or from L-level to H-level. In this way a clock having a multiplied frequency is generated.

FIG. 3 is a block diagram illustrating the structure of one delay line. Each delay unit $U_1$, $U_2$, $U_3$, $U_4$ . . . $U_{15}$ is composed of two inverters connected in series. The clock

2 input terminal IN is connected to the input terminal of the delay unit $U_1$ whose output terminal is connected to the input terminal of the delay unit $U_2$. The output terminal of the delay unit $U_2$ is connected to the input terminal of the delay unit $U_3$ whose output terminal is connected to the input terminal of the delay unit $U_4$.

Likewise, many delay units $U_5$, $U_6$ . . . $U_{15}$ are connected in cascade. The connection point between the clock input terminal IN and the delay unit $U_1$ is connected to one of the input terminals of a NAND circuit constituting a gate G0, and the other input terminal is connected to a delay selecting terminal SEL0 to which a delay selecting signal is to be inputted. The connection point between the delay units $U_1$ and $U_2$ is connected to one of the input terminals of a NAND circuit constituting a gate G1, and the other input terminal is connected to a delay selecting terminal SEL1 to which a delay selecting signal is to be inputted.

The connection point between the delay units $U_2$ and $U_3$ is connected to one of the input terminals of a NAND circuit constituting a gate G2, and the other input terminal is connected to a delay selecting terminal SEL2 to which a delay selecting signal is to be inputted. The connection point between the delay units $U_3$ and $U_4$ is connected to one of the input terminals of a NAND circuit constituting a gate G3, and the other input terminal is connected to a delay selecting terminal SEL3 to which a delay selecting signal is to be inputted.

The connection point between the delay units $U_4$ and $U_5$ is connected to one of the input terminals of a NAND circuit constituting a gate G4, and the other input terminal is connected to a delay selecting terminal SEL4 to which a delay selecting signal is to be inputted. In this way, gates G5, G6 . . . G15 and delay selecting terminals SEL5, SEL6 . . . SEL15 are provided. The gates G20, G21, G22, G23 and G30 are constituted by connecting the output terminal of a NAND circuit to the input terminal of an inverter.

Each output terminal of the gates G0, G1, G2 and G3 is respectively connected to each of the input terminals of 4-inputs NAND circuit of the gate G20, and each output terminal of the gates G4, G5, G6 and G7 is respectively connected to each of the input terminals of 4-inputs NAND circuit of the gate G21. Each output terminal of the gates G8, G9, G10 and G11 is respectively connected to each of the input terminals of 4-inputs NAND circuit of the gate G22, and each output terminal of the gates G12, G13, G14 and G15 is respectively connected to each of the input terminals of 4-inputs NAND circuit of the gate G23. Each output terminal of the gates G20, G21, G22 and G23 is respectively connected to each of the input terminals of 4-inputs NAND circuit of the gate G30. The output terminal of the gate G30 is connected to the input terminal of gate G40 constituted by an inverter whose output terminal is connected to a clock output terminal OUT.

The operation of this delay line is described:

The delay selecting terminal SEL0, SEL1 . . . SEL15 are controlled such that one of them is exclusively H-level. For example, if the delay selecting terminal SEL1 becomes H-level, the clock inputted to the clock input terminal IN is transmitted to the output terminal OUT through the delay unit $U_1$ and gates G1, G20, G30 and G40.

If the delay selecting terminal SEL4 receives a signal of H-level, the clock inputted to the clock input terminal IN is transmitted to the clock output terminal OUT through the delay units $U_1$, $U_2$, $U_3$ and $U_4$ and gates G4, G21, G30 and G40. The time difference between the clock transmission delay time from the clock input terminal IN to the clock output terminal OUT when the delay selecting terminal SEL1 receives the H-level signal, and the clock transmission delay time from the clock input terminal IN to the clock output terminal OUT when the delay selecting terminal SEL4 receives the H-level signal is the sum of each delay time of the delay units $U_2$, $U_3$ and $U_4$.

In this way, by selecting a delay selecting terminal to which the H-level signal is to be applied, the clock transmission delay time from the clock input terminal IN to the clock output terminal OUT varies by an integral multiple of the delay time introduced by the delay unit. The pulse width and interval of a generating clock $CLK_{out}$ are changed by varying the delay time.

However, even when the delay selecting terminal SEL0 receives the H-level signal, and the delay time of the clock transmission is minimized, the clock inputted to the clock input terminal IN is transmitted to the clock output terminal OUT through the gates G0, G20, G30 and G40. As a result, the delay time cannot be shorter than that of the transmission through the gates G0, G20, G30 and G40, so that a higher frequency clock cannot be generated. Even if the delay selecting terminal SEL0 receives the H-level signal, the clock passes through the delay units $U_1$ and $U_2$, and passes through all the delay units $U_3$, $U_4$ ... $U_{15}$ connected in cascade. As a result, the inverter constituting the delay units performs a switching operation, thereby causing the delay units $U_1$ to $U_{15}$ to consume electricity. Electric power is wastefully consumed.

SUMMARY OF THE INVENTION

The present invention is devised to solve the problems discussed above, and an object of the invention is to provide a clock generating circuit capable of shortening a clock transmission delay time and consuming less power.

A clock generating circuit of the invention comprises a plurality of delay lines connected in cascade, each delay line including a plurality of delay units connected in cascade, consisting of two switching elements for letting in or shutting out a clock and a delay element connected to each of the switching elements. Clocks from the delay lines are inputted to a logic circuit unit. A first clock is inputted to the delay units so that one of the switching elements of one delay unit is turned on and the other is turned off. Conversely, one of the switching elements in each of the other delay units is turned off and the other is turned on. The first clock is transmitted through the turn-on switching element and the delay element, and is successively transmitted through the other switching elements and delay elements of the subsequent delay units. Thus, the delay time of the first clock merely depends upon the delay time of the delay element. The first clock is not transmitted to the delay units located before the delay unit whose switching element is turned on.

The above-mentioned clock generating circuit may be provided with a selecting means for selecting one of the plurality of delay units. When the first clock is inputted to the selecting means, it passes through one of the switching elements of the delay unit to which it is inputted and the delay element, and is successively transmitted to the subsequent delay units. In this way the transmission path of the first clock until it is inputted to the delay unit is shortened, thereby reducing stray capacitance.

Further the clock generating circuit may be provided with an arrangement in which the delay lines and the logic circuits are alternately connected, instead of the arrangement of the logic circuit unit, wherein the first clock is inputted to one of the input terminals of each logic circuit. When the first clock is inverted, an output clock of each logic circuit is inverted. After lapse of the delay time introduced by the delay line, an output clock of the preceding delay line is inverted, and an output clock of each logic circuit is inverted. In this way a clock having an integral multiple of a frequency of the first clock is generated.

Still further the clock generating circuit may be provided with a phase comparator to which a clock outputted from the delay line in the last stage are to be inputted, and a control circuit for controlling the delay time of the delay lines on the basis of an output signal of the phase comparator. An output of each of the delay lines is inputted to the logic circuit unit. In this constitution the phases of the first clock and the output clock of the delay line in the last stage are compared. The control circuit controls the delay time introduced by the delay line on the basis of the result of comparison. In this way, a clock having an integral multiple of a frequency of the first clock is generated, thereby achieving a 50% duty ratio.

Further the clock generating circuit may be provided with an arrangement in which the delay lines and the logic circuits are alternately connected wherein the first clock is inputted to one of the input terminals of each logic circuit. In addition to the phase comparator and the control circuit, the circuit is provided with a frequency comparing division to receive an output clock of each delay line. In this constitution, when the first clock is inverted, an output clock of each logic circuit is inverted. After lapse of the delay time introduced by the delay line, an output clock of the preceding delay line is inverted, and an output clock of each logic circuit is inverted. By referring to the logic level at the time of comparing the phases of the output clocks from each delay line, it is detected whether the frequency falls within a predetermined range, the delay time introduced by the delay lines is controlled in accordance with an output signal of the phase comparator. In this way, a clock having an integral multiple of a frequency of the first clock is generated.

Further a frequency binary divider circuit is additionally provided to divide the frequency of the first clock to two in the front stage of the delay lines. Even if the duty ratio of the first clock is below 50%, a clock having a binary divided frequency has a 50% duty ratio. When the clock having a binary divided frequency is inputted to the delay lines, a clock having an integral multiple of a frequency of the first clock is generated on the basis of an output clock of each delay line. Thus, the duty ratio of the clock having a multiplied frequency becomes a 50% in spite of the duty ratio of the first clock.

Further each of the delay lines may be divided into a first delay line section and a second delay line section, and the delay time of the delay units in the first and second delay line sections are differentiated from each other, thereby enabling the delay time introduced by the delay lines to vary in a wide range with a less number of the delay units.

Still further the clock generating circuit may be additional provided with a first phase comparator and a second phase comparator to which a first clock and a clock outputted from the delay line in the last stage are to be inputted, a first control circuit for controlling the delay time of the first delay line section on the basis of an output signal of the first phase comparator, and a second control circuit for controlling the delay time of the second delay line section on the basis of an output signal of the second phase comparator, and a lock detecting circuit for detecting a lock condition of a clock on the basis of an output signal of the first phase comparator, and controlling the let-in and shut-out of the output signals of the second phase comparator and the second control circuit. In this constitution, the phases of a first clock and an output clock of the delay line in the last stage are respectively compared by the first and second phase comparators. The delay time of the first delay line section is controlled by the first control circuit until it is detected that the output clock is in the lock condition. When it is detected that it is in the lock condition, the second control circuit controls the delay time of the second delay line section on the basis of an output signal of the second phase comparator. In this way, the delay time is roughly controlled until the lock condition is reached, and the delay time is finely controlled after the lock condition is reached. In addition, a clock having an integral multiple of the first clock frequency.

Another object of the present invention is to provide a semiconductor device capable of raising the frequency of a clock to be generated, and dissipating less power.

The semiconductor device is provided with the clock generating circuit having one or combination of above-mentioned constitutions so that the delay time of each of the delay lines is varied solely by depending upon the delay time of each delay unit. A clock having a pulse width and interval in accordance with the delay time of the delay lines, and also having an integral multiple of the frequency of the inputted clock is generated. The number of delay units through which the clock passes is limited on the basis of the delay time to be introduced.

The present invention also provides methods for designing and making a clock generating circuit capable of generating a clock having an integral multiple of the frequency of an inputted clock.

In the present invention, the number K of delay units to be connected in cascade for constructing one delay line is calculated from the following equation:

$$K \geq [\{1/(2 \cdot N \cdot F_{ref})\} - (T_{rest})]/(T_{delin})$$

Furthermore, the present invention provides a PLL circuit capable of multiplying the frequency of a clock, and synchronizing the multiplied clock with the pre-multiplied clock, thereby minimizing the consumption of power.

In the PLL circuit of the present invention the above-mentioned clock generating circuit is provided before a phase synchronizing circuit, and a first clock, an output clock of the clock generating circuit and an output clock of the phase synchronizing circuit are inputted to the phase synchronizing circuit. Alternatively, the clock generating circuit may be provided after the phase synchronizing circuit to which a first clock and an output clock of the phase synchronizing circuit are inputted to the phase synchronizing circuit. The clock generating circuit delay an input clock by the delay lines constituted by delay units connected in cascade, and generates a clock having a multiplied frequency on the basis of the delayed clock. When the generated clock and the clock inputted to the clock generating circuit are inputted to the phase synchronizing circuit, the generating clock becomes synchronized with the clock inputted to the clock generating circuit.

The above and further objects and features of the invention will more fully be apparent from the following detailed description with accompanying drawings.

DESCRIPTION OF THE PREFERRED EMBODIMENTS

Embodiment 1

Figure 1:
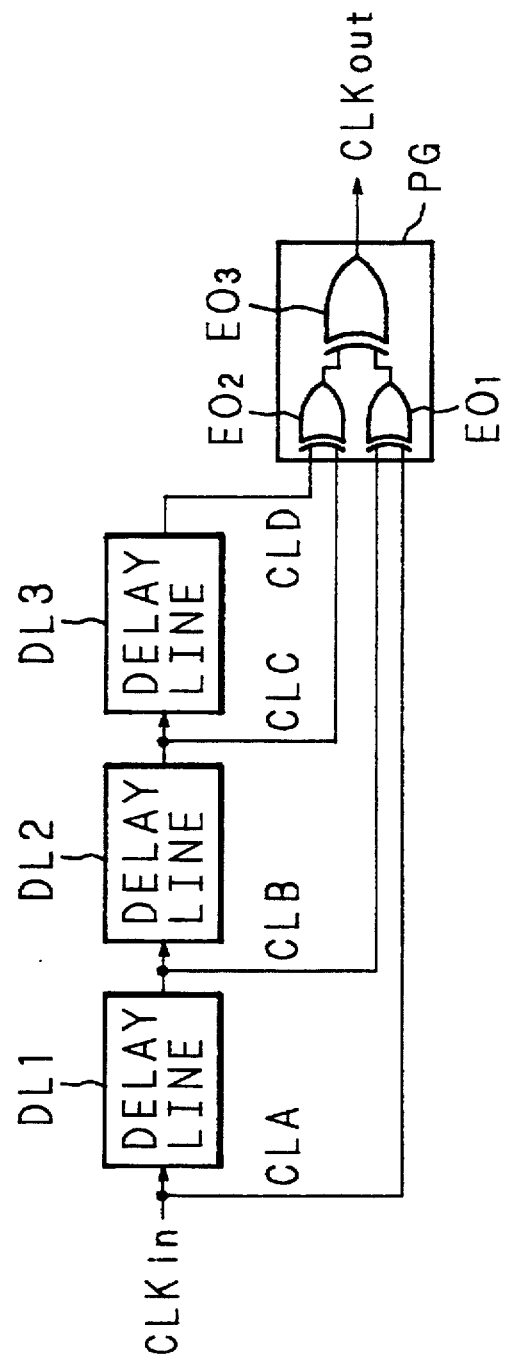
FIG. 1 is a block diagram illustrating the structure of a conventional clock generating circuit.
Figure 2:
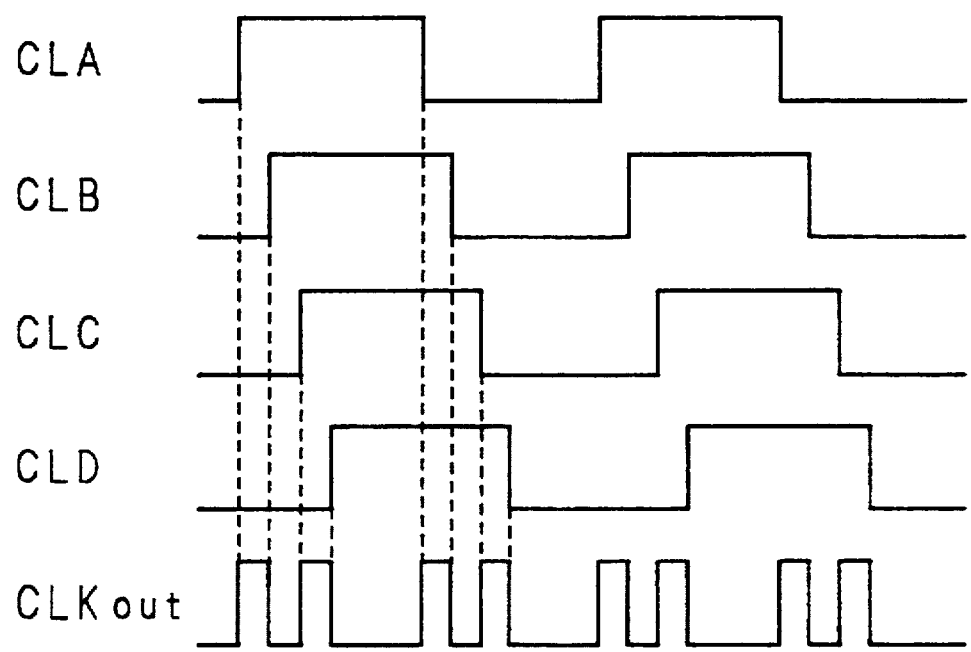
FIG. 2 is a timing chart of a clock generated from each component.
Figure 3:
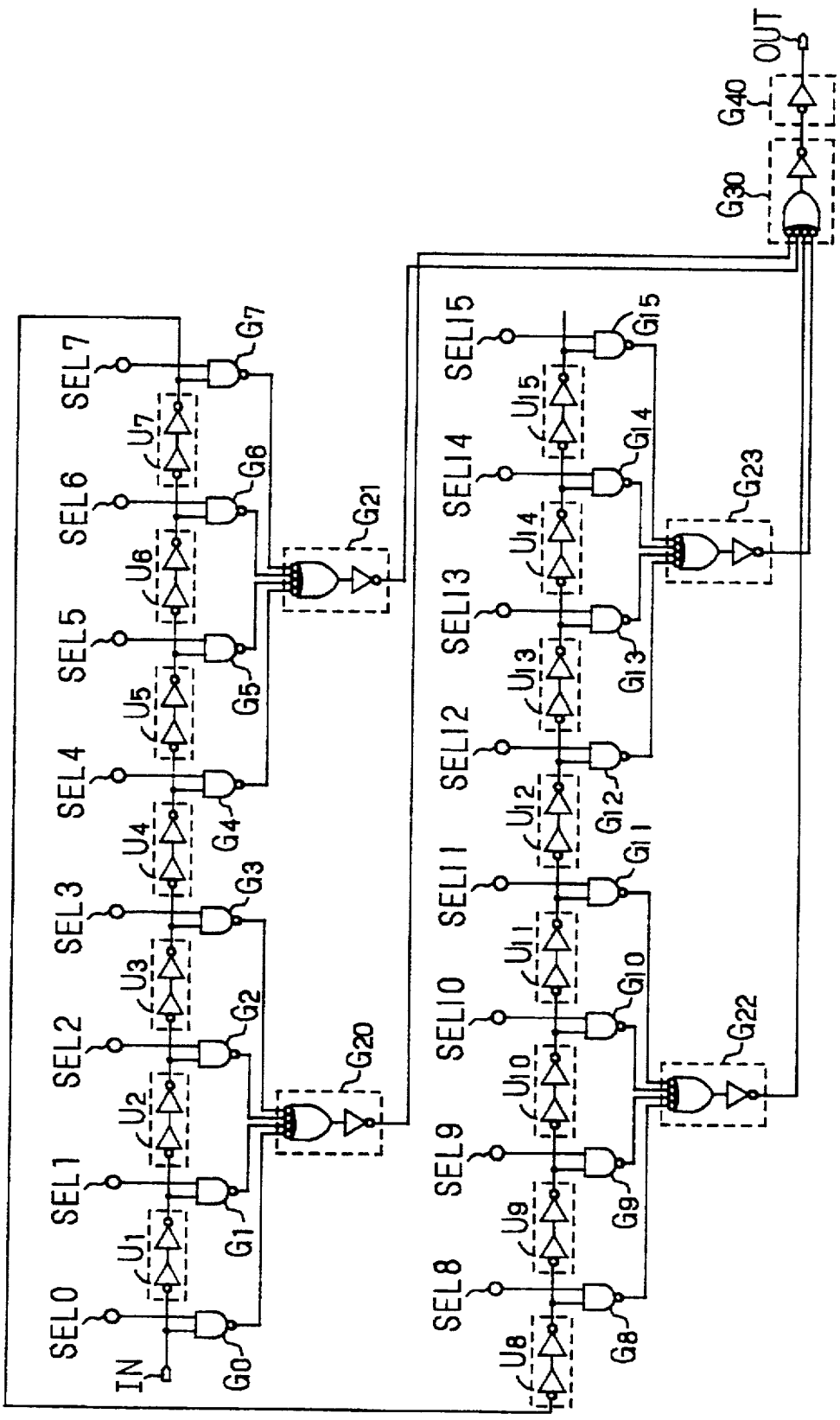
FIG. 3 is a block diagram illustrating the structure of the delay line in FIG. 1.
Figure 4:
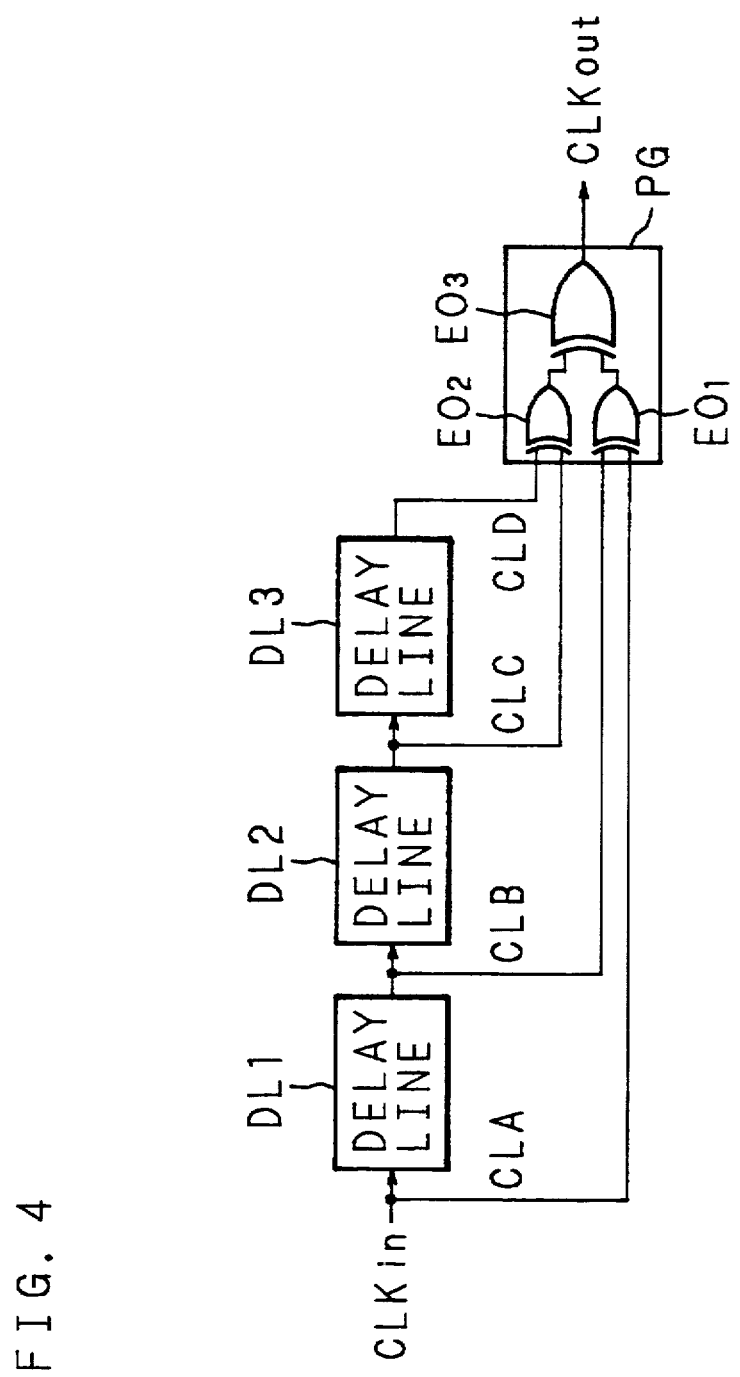
FIG. 4 is a block diagram showing a clock generating circuit according to Embodiment 1 of the present invention.

FIG. 4 is a block diagram of a clock generating circuit according to Embodiment 1 of the invention. A clock $CLK_{in}$ successively passes through delay lines DL1, DL2 and DL3 in cascade connection. The pulse generating circuit PG is made of three EXOR circuits $E0_1$, $E0_2$ and $E0_3$. An input clock CLA and output clock CLB of the delay line DL1 are inputted to the respective input terminals of the EXOR circuit $E0_1$. An output clock of the delay line DL2, that is, an input clock CLC of the delay line DL3 and an output clock CLD of the delay line DL3 are inputted to the respective input terminals of the EXOR circuit $E0_2$. Output clocks of the EXOR circuits $E0_1$ and $E0_2$ are inputted to the respective input terminals of the EXOR circuit $E0_3$. A clock $CLK_{out}$ having a multiplied frequency is outputted from the EXOR circuit $E0_3$.

Figure 5:
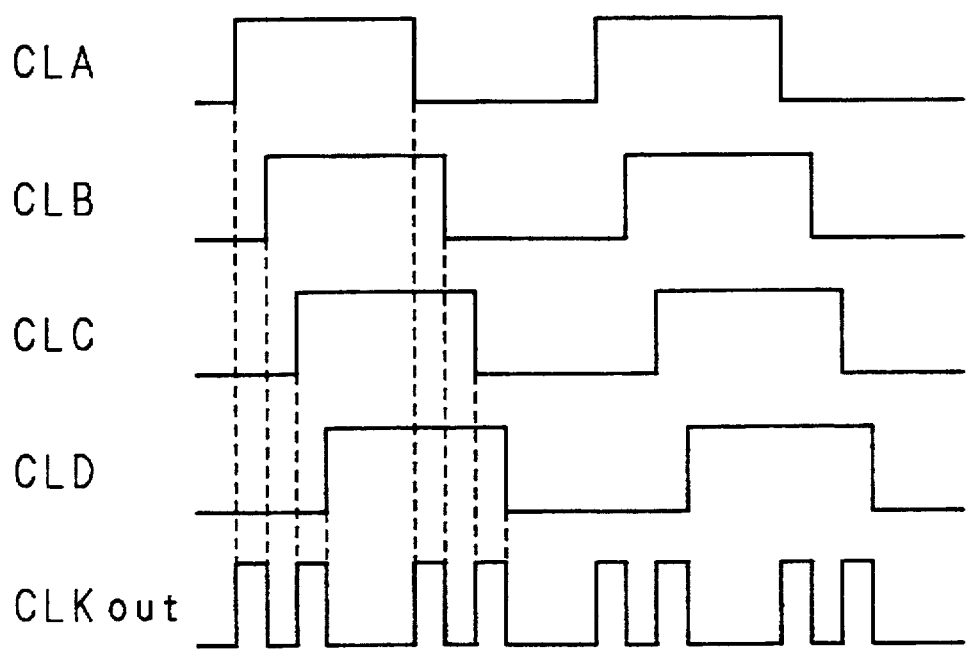
FIG. 5 is a timing chart of a clock generated from each component.

The operation of the clock generating circuit constructed in this way will be described referring to FIG. 5, which shows a timing chart of clocks in each component. A clock $CLK_{in}$ inputted to the delay line DL1 successively passes through the delay lines DL1, DL2 and DL3 at each of which the clock is delayed. The clock CLA inputted to the delay line DL1 and the output clocks CLB, CLC and CLD of the delay lines DL1, DL2 and DL3 take the waveforms as shown in FIG. 5. When the delayed clocks CLA, CLB, CLC and CLD are inputted to the pulse generating circuit PG, the clock $CLK_{out}$ becomes H-level in response to one of the clocks CLA and CLB being H-level, owing to the logic of the clocks CLA and CLB, and becomes H-level in response to one of the clocks CLC and CLD being H-level, owing to the logic of the clocks CLC and CLD. In this way a clock multiplied the frequency of the clock $CLK_{in}$ is obtained.

Figure 6:
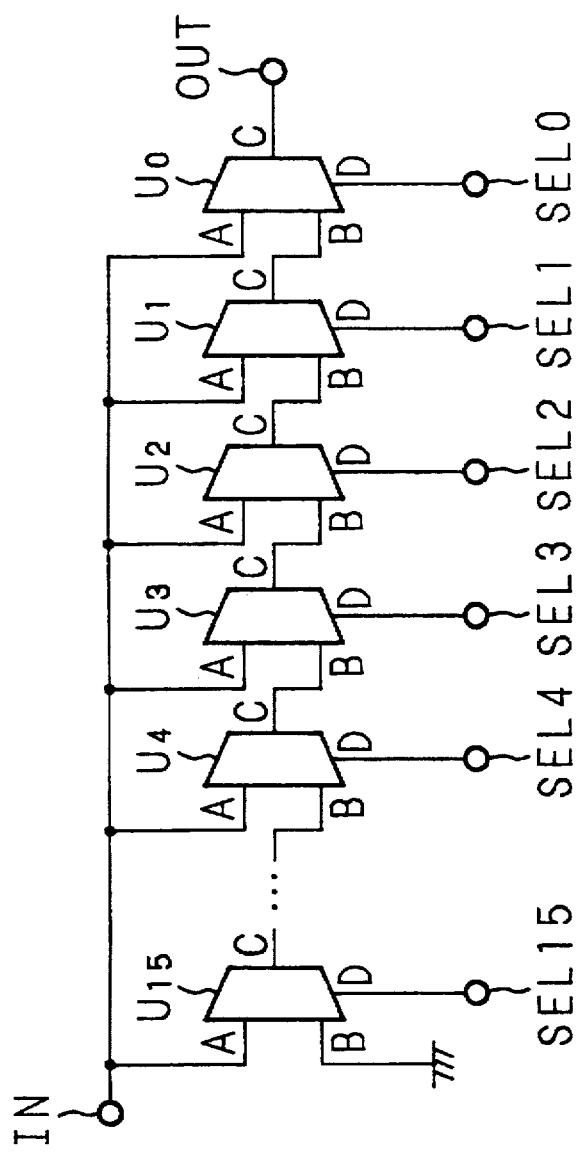
FIG. 6 is a block diagram illustrating the structure of an example of a delay line.

FIG. 6 is a block diagram illustrating an example of the delay line. A clock input terminal IN is connected to each of first input terminals A of delay units $U_0$, $U_1$, $U_2$, $U_3$, $U_4$ . . . $U_{15}$. A second input terminal B of the delay unit $U_{15}$ is grounded. An output terminal C of the delay unit $U_{15}$ is connected to a second input terminal of the subsequent delay unit. The same connection follows. More specifically, an output terminal C of the delay unit $U_4$ is connected to a second input terminal B of the delay unit $U_3$. An output terminal C of the delay unit $U_3$ is connected to a second input terminal B of the delay unit $U_2$. An output terminal C of the delay unit $U_2$ is connected to a second input terminal B of the delay unit $U_1$. An output terminal C of the delay unit $U_1$ is connected to a second input terminal B of the delay unit $U_0$. An output terminal C of the delay unit $U_0$ is connected to a clock output terminal OUT. Each of the delay units $U_0$, $U_1$, $U_2$, $U_3$, $U_4$ . . . $U_{15}$ has control terminal D connected to each of delay selecting terminals SEL0, SEL1, SEL2, SEL3, SEL4 . . . and SEL15 to which delay selecting signals are respectively inputted.

Figure 7:
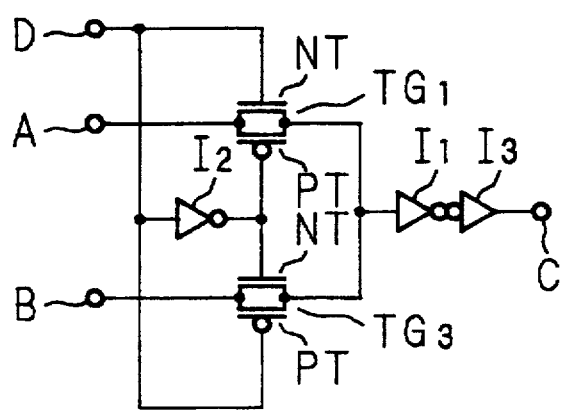
FIG. 7 is a block diagram illustrating the structure of an example of a delay unit.

FIG. 7 is a block diagram illustrating an example of the delay unit. The first input terminal A of each of the delay units $U_0$, $U_1$, $U_2$, . . . $U_{15}$ is connected to an input terminal of an inverter $I_1$ performing delay operation through a transfer gate $TG_1$. The second input terminal B thereof is connected to the input terminal of the inverter $U_1$ through a transfer gate $TG_3$.

The control terminal D connected to the aforementioned delay selecting terminal is connected to a gate of an N-channel transistor NT of the transfer gate $TG_1$ and to a gate of a P-channel transistor PT of the transfer gate $TG_3$. It is also connected to a gate of the P-channel transistor PT of the transfer gate $TG_1$ and to a gate of an N-channel transistor NT of the transfer gate $TG_3$ through an inverter $I_2$. The output terminal of the inverter $I_1$ is connected to an input terminal of an inverter $I_3$, whose output terminal is connected to the output terminal C.

The operation of the delay line will be described:

In the delay unit, when the control terminal D receives an H-level signal, the transfer gate $TG_1$ is on, so that the clock inputted to the first input terminal A is transmitted to the output terminal C after a period of delay time effected by the inverters $I_1$ and $I_3$ performing delay operation. When the control terminal D is in L-level, the transfer gate $TG_3$ is on, so that the output terminal C is fixed to the ground potential. In each of the delay lines DL1, DL2, and DL3 any of the delay selecting terminals SEL0, SEL1, SEL2, SEL3, SEL4 . . . SEL15 is controlled to be in H-level. When the delay selecting terminal SEL1 is in H-level, the only delay unit $U_1$ receives a clock through the first input terminal A, and the other delay units $U_0$, $U_2$, $U_3$, $U_4$ . . . $U_{15}$ signals through the second input terminals B. The output terminals C of the delay units $U_2$, $U_3$, $U_4$ . . . $U_{15}$ located forward of the delay unit $U_1$ is fixed to ground potential.

The delay unit $U_0$ receives the clock received by the delay unit $U_1$. As a result, the delay time of the clock in this case is the sum of the delay times of the delay units $U_1$ and $U_0$. When the delay selecting terminal SEL2 alone is in H-level, the delay time of the clock is the sum of the delay times of the delay unit $U_0$, $U_1$ and $U_2$. In this way, the delay time of a clock in the delay line varies in accordance with the delay selecting terminals selected. When, for example, the delay selecting terminal SEL1 alone is in H-level, a clock is transmitted only through the delay units $U_0$ and $U_1$, and not through the delay units $U_2$ . . . $U_{15}$. As a result, power is consumed only on the delay units $U_1$ and $U_0$.

As the delay time is shortened, that is, as the frequency of the generating clock becomes higher, the consumption of power is reduced, thereby contributing to power-saving. In addition, since the delay line outputs a clock delayed by the delay units directly, not through any gate except for the delay unit, the delay time of a clock can be shortened to that of one delay unit. As a result, multiplying number of the frequency of a clock can be large extremely, a clock having a very high frequency can be generated.

Figure 8:
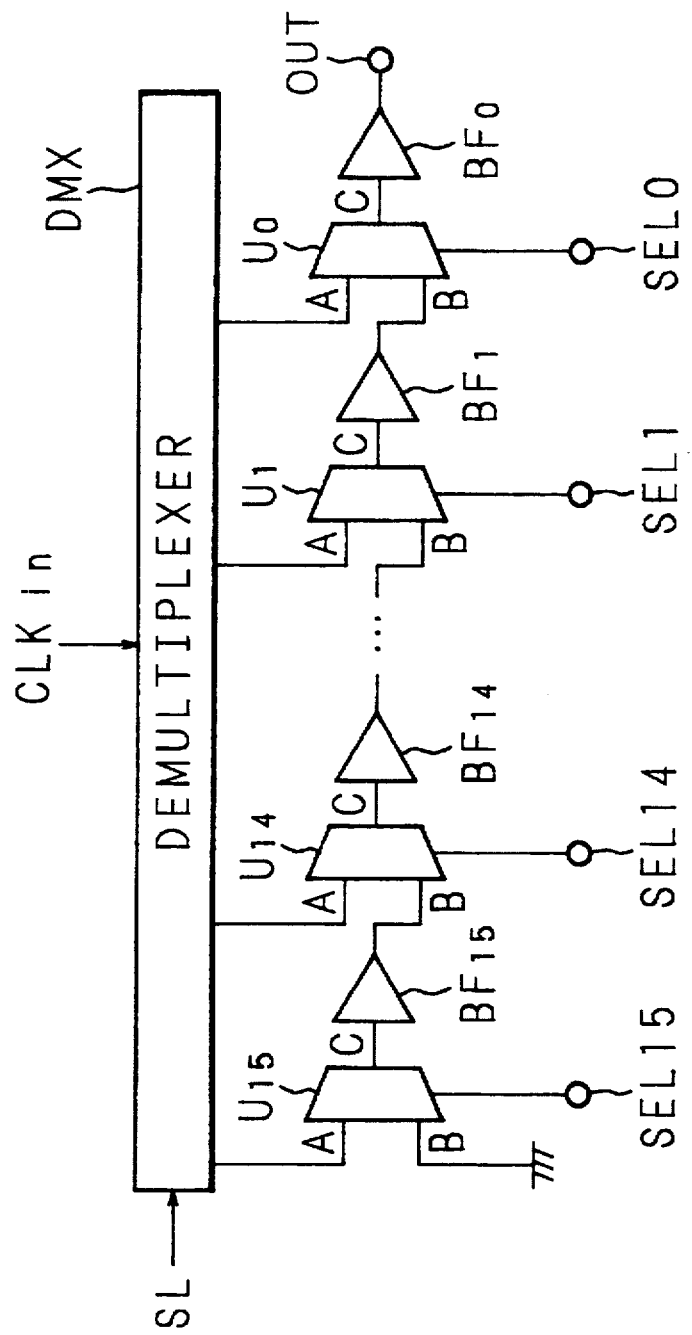
FIG. 8 is a block diagram illustrating the structure of another example of a delay unit.

FIG. 8 is a block diagram showing another example of the delay line. A clock $CLK_{in}$ is inputted to a common terminal of a demultiplexer DMX. The common terminal is connected, through a plurality of switching terminals, to each of the first input terminals of delay units $U_{15}$, $U_{14}$ . . . $U_1$, $U_0$ having the same structure as that shown in FIG. 7. A delay selecting signal SL selects one among the plurality of switching terminals. The delay unit $U_{15}$ is grounded at a second input terminal B. An output terminal C of the delay unit $U_{15}$ is connected to a second input terminal B of the delay unit $U_{14}$ through a buffer BF performing delay operation. An output terminal C of the delay unit $U_{14}$ is connected to a second input terminal of the subsequent delay unit through a buffer $BF_{14}$ performing delay operation. The same connection follows. An output terminal C of the delay unit $U_1$ is connected to a second input terminal B of the delay unit $U_0$ through a buffer $BF_1$ performing delay operation. The output terminal C of the delay unit $U_0$ is connected to a clock output terminal OUT through a buffer $BF_0$.

The operation of the clock generating circuit will be described:

The selection of switching terminals in the demultiplexer DMX is controlled by the delay selecting signal SL, so that, for example, the clock $CLK_{in}$ is inputted to the first input terminal A of the delay unit $U_1$. The delay selecting signal SL raises the delay selecting terminal SEL1 to H-level. As the result the clock inputted to the delay unit $U_1$ is delayed in the same manner as the case shown in FIG. 6, and is inputted to the buffer $BF_1$ whereby it is further delayed. Then, the clock is inputted to the delay unit $U_0$ whereby it is still further delayed, and is again delayed by the buffer $BF_0$. Finally the delayed clock is outputted to the clock output terminal OUT.

By controlling the selection in the demultiplexer DMX a clock is outputted with a predetermined delay time when a clock is inputted to another delay unit. This is the same operation as the case shown in FIG. 6.

The delay time can be varied by the delay lines, thereby reducing the power consumption, and increasing the multiplication of the frequency of the clock. In addition, since the clock inputted to the demultiplexer can be inputted to a selected delay unit, the transmission path of the clock is shortened. As a result, a parasitic capacitance contained in the transmission path is reduced, thereby decreasing current wastefully flowing through the parasitic capacitance. This leads to power-saving.

Embodiment 2

Figure 9:
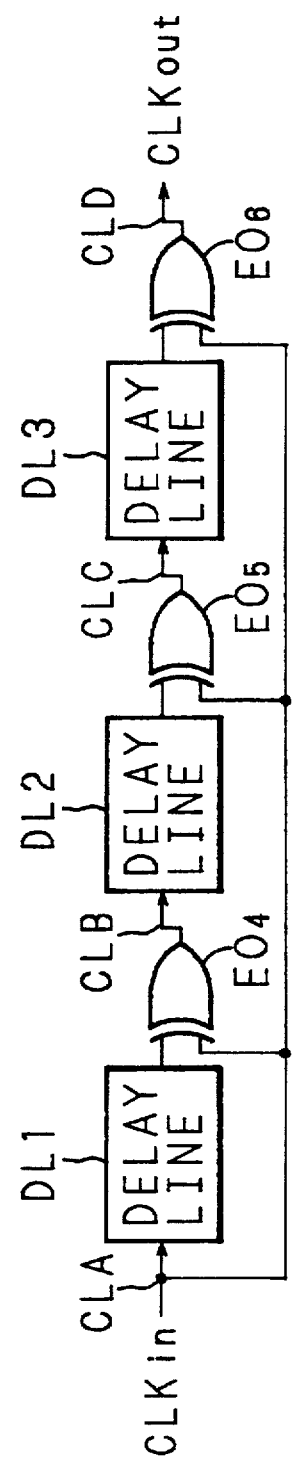
FIG. 9 is a block diagram showing a clock generating circuit according to Embodiment 2.

FIG. 9 is a block diagram showing a clock generating circuit according to Embodiment 2. A clock $CLK_{in}$ (CLA) is inputted to a delay line DL1 whose output clock is inputted to one of the input terminals of an EXOR circuit $E0_4$. The output clock CLB of the EXOR circuit $E0_4$ is inputted to a delay line DL2 whose output clock is inputted to one of the input terminals of an EXOR circuit $E0_5$. The output clock CLC of the EXOR circuit $E0_5$ is inputted to a delay line DL3 whose output clock is inputted to one of the input terminals of an EXOR circuit $E0_6$. The clock $CLK_{in}$ is inputted to each of the other input terminals of the EXOR circuits $E0_4$, $E0_5$ and $E0_6$.

Figure 10:
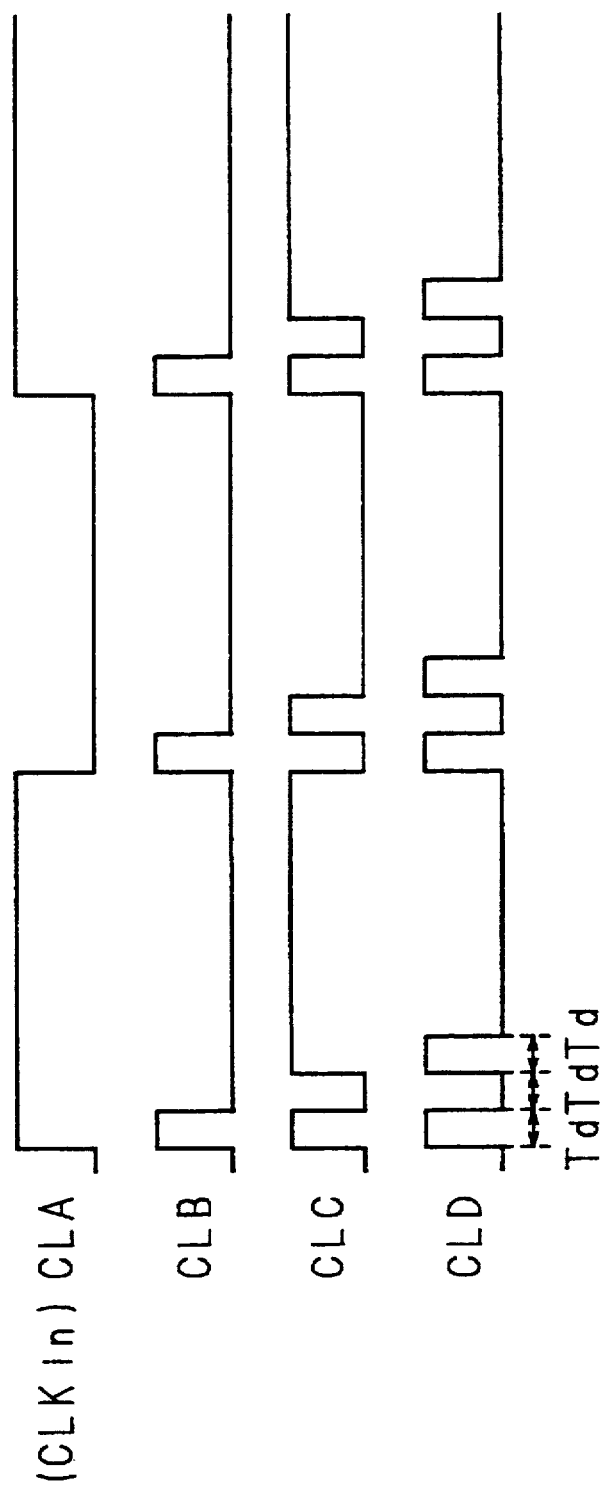
FIG. 10 is a timing chart of a clock generated from each component.

As indicated by the timing chart in FIG. 10 the clock generating circuit of Embodiment 2 simultaneously inverts each of the input clocks CLA, CLB and CLC of the delay lines DL1, DL2 and DL3 when the clock $CLK_{in}$ changes from L-level to H-level. Subsequently, the output clock of the preceding delay line changes from L-level to H-level after a delay time $T_d$ corresponding to a single delay line lapses. As a result, the output clock of each of the EXOR circuits, namely, the input clock of each of the delay lines are reversed. By repeating this process, a clock CLD whose frequency is an integral multiple of that of the clock $CLK_{in}$ is generated.

Embodiment 3

Figure 11:
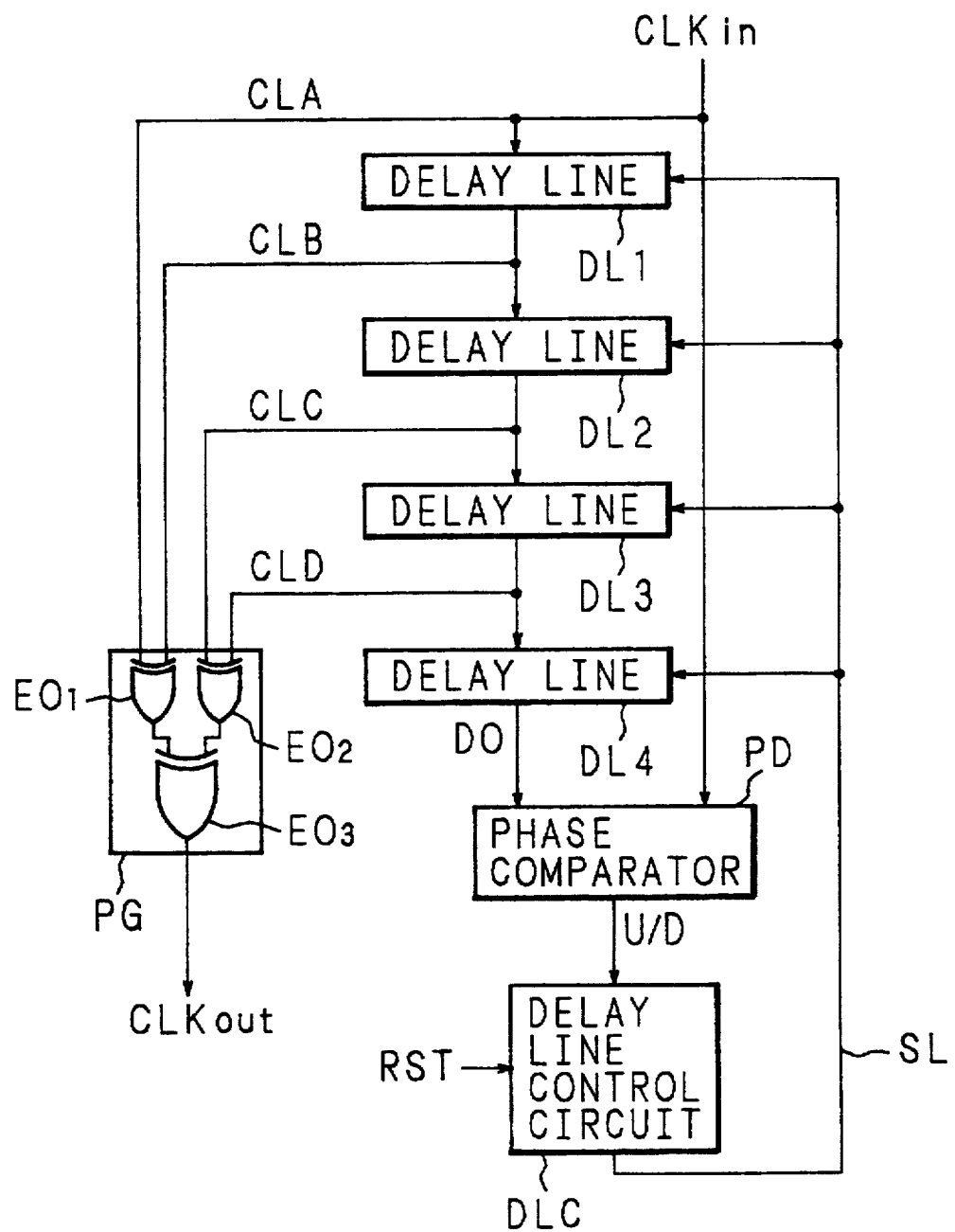
FIG. 11 is a block diagram showing a clock generating circuit according to Embodiment 3.

FIG. 11 is a block diagram of a clock generating circuit according to Embodiment 3. Delay lines DL1, DL2, DL3 and DL4 are in cascade connection. A clock $CLK_{in}$ is inputted to a first terminal of a phase comparator PD, and an output clock of the delay line DL4 is inputted to a second terminal of the phase comparator PD. An up/down signal U/D outputted from the phase comparator PD is inputted to a delay line control circuit DLC to which a reset signal RST is inputted. A delay selecting signal SL outputted from the delay line control circuit DLC is inputted to the delay lines DL1, DL2, DL3 and DL4. The other structure is the same as that illustrated in FIG. 4, wherein like components and elements are designated by like reference numerals. The delay lines DL1, DL2, DL3 and DL4 are structured in the same manner as shown in FIG. 6.

Figure 12:
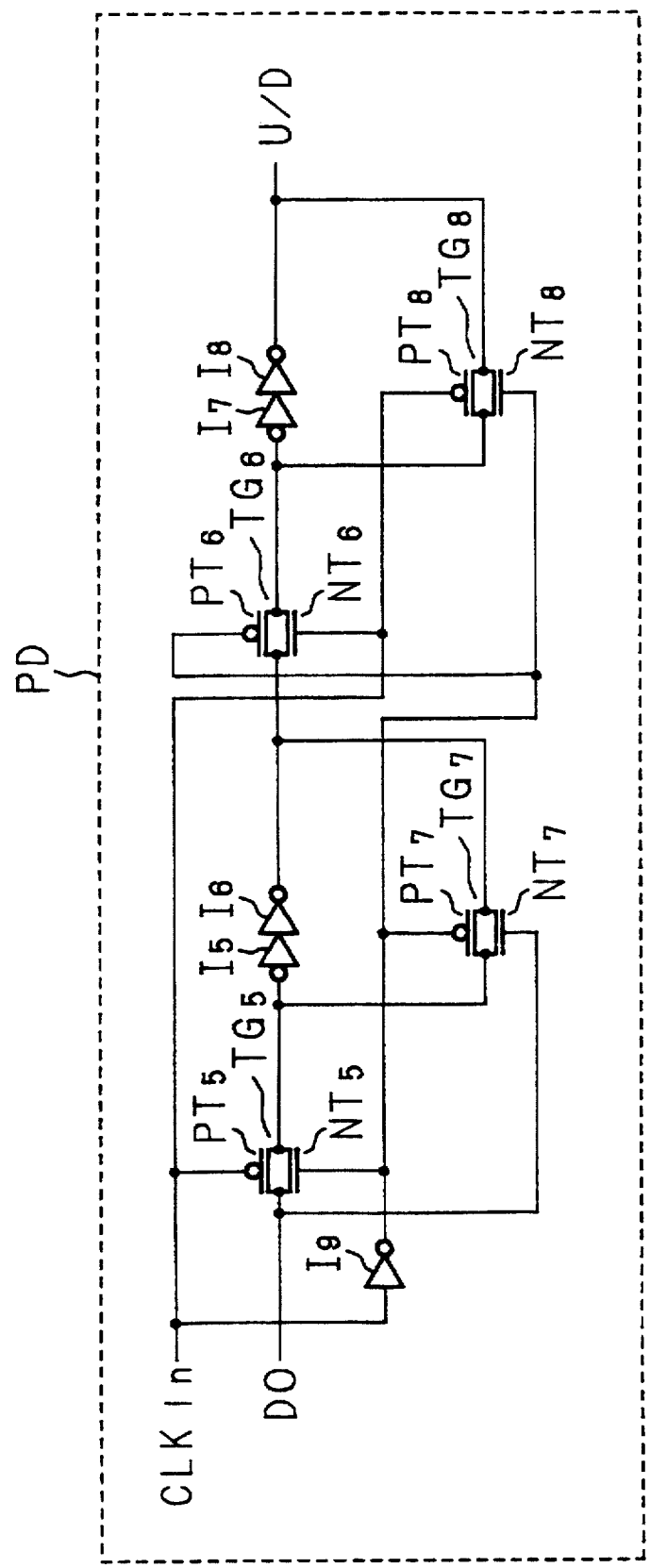
FIG. 12 is a block diagram illustrating the structure of a phase comparator.

FIG. 12 is a block diagram of the phase comparator PD which is constituted by a latch circuit. An output clock DO from the delay line DL4 (refer to FIG. 11) in the last stage is inputted to one of the terminals of a transfer gate $TG_5$ whose other terminal is connected to an input terminal of an inverter $I_5$ having an output terminal connected to an input terminal of an inverter $I_6$. An output terminal of the inverter $I_6$ is connected to a terminal of a transfer gate $TG_6$. The other terminal of the transfer gate $TG_6$ is connected to an input terminal of an inverter $I_7$ whose output terminal connected to an input terminal of an inverter $I_8$. From output terminal of the inverter $I_8$ is outputted the up/down signal U/D.

A transfer gate $TG_7$ is connected in parallel to a series circuit of the inverters $I_5$ and $I_6$. A transfer gate $TG_8$ is connected in parallel to a series circuit of the inverters $I_7$ and $I_8$. An input terminal of an inverter $I_9$ is connected to each gate of a P-channel transistor $PT_5$ of the transfer gate $TG_5$, an N-channel transistor $NT_6$ of the transfer gate $TG_6$, and a P-channel transistor $PT_8$ of the transfer gate $TG_8$. The output terminal of the inverter $I_9$ is connected to each gate of an N-channel transistor $NT_5$ of the transfer gate $TG_5$, a P-channel transistor $PT_7$ of the transfer gate $TG_7$, a P-channel transistor $PT_6$ of the transfer gate $TG_6$, an N-channel transistor $NT_8$ of the transfer gate $TG_8$. The output clock DO is inputted to the N-channel transistor $NT_7$ of the transfer gate $TG_7$.

Figure 13:
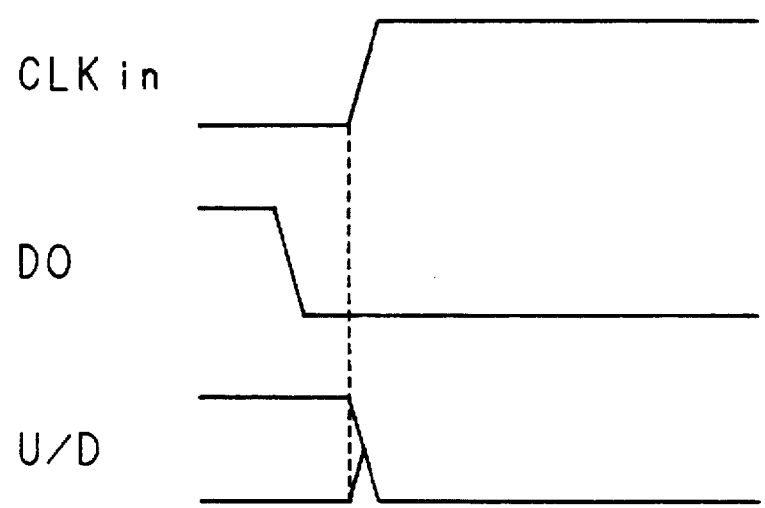
FIG. 13 is a timing chart of a clock and an up/down signal.
Figure 14:
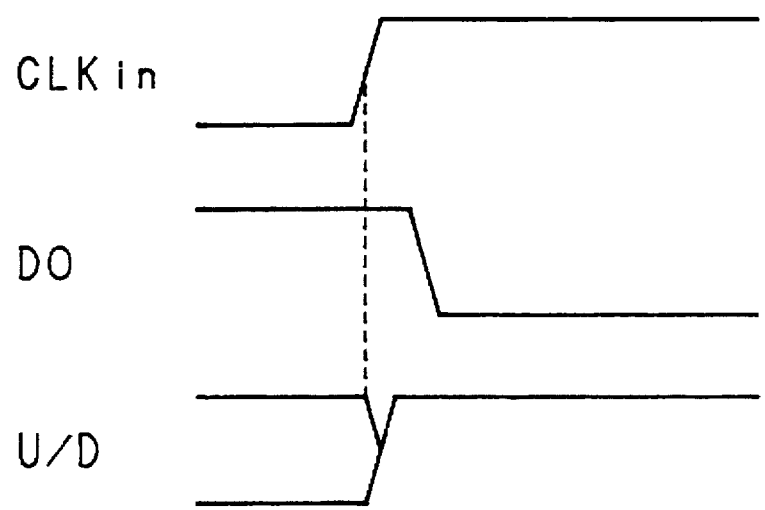
FIG. 14 is a timing chart of a clock and an up/down signal.

The up/down signal U/D outputted from the phase comparator PD latches the logical level of the output clock DO of the delay line DL4 at which the clock $CLK_{in}$ changes from L-level to H-level. More specifically, when the output clock DO for the clock $CLK_{in}$ is in the phase shown in FIG. 13, it becomes L-level, whereas when the phase is as shown in FIG. 14, it becomes H-level.

Figure 15:
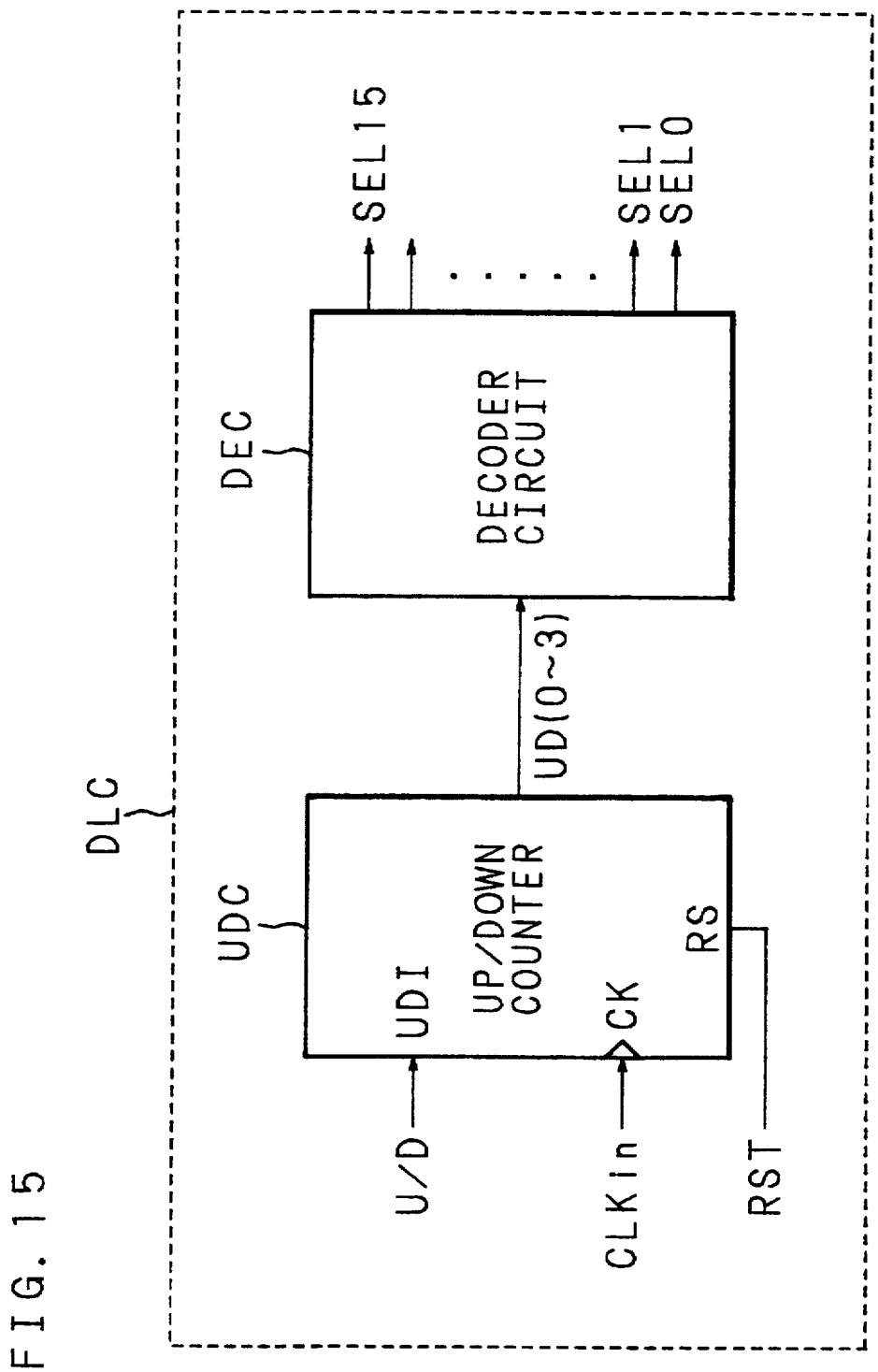
FIG. 15 is a block diagram illustrating the structure of a delay line control circuit.

FIG. 15 is a block diagram illustrating the structure of the delay line control circuit DLC. The up/down signal U/D, the clock $CLK_{in}$ and the reset signal RST are respectively inputted to an input terminal UD1, a clock terminal CK and a reset terminal RS of an up/down counter UDC. The clock can be either the clock $CLK_{in}$ or any other clock which is changeable in synchronism with the clock $CLK_{in}$. The count data UD (0 to 3) of the up/down counter UDC is inputted to a decoder circuit DEC so as to select one of the delay selecting terminals SEL0 to SEL15 and make it H-level.

In the delay line control circuit DLC, when the reset signal RST is L-level, the up/down counter UDC makes the 4-bit value of the count data UD (0 to 3) "0, 0, 0, 0". When the up/down signal U/D is H-level, the value of the count data is decreased by "1" in synchronism with the clock $CLK_{in}$. When the up/down signal U/D is L-level, the value of the count data is increased by "1". The decoder circuit DEC decodes the value of the count data UD (0 to 3), and supplies the H-level signal to one of the delay selecting terminals SEL0 to SEL15. When the value of the count data UD (0 to 3) is "0, 0, 0, 0", the delay selecting terminal SEL0 is selected. When it is "1, 1, 1, 1", the delay selecting terminal SEL15 is selected.

The operation of the clock generating circuit of Embodiment 3 will be described:

When the clock $CLK_{in}$ is supplied, and the reset signal RST of the delay line control circuit DLC is made L-level for at least one cycle, the value of the count data UD (0 to 3) of the up/down counter UDC becomes 0 and the delay selecting terminal SEL0 alone receives the H-level signal. Immediately after resetting, the delay time of each delay line is shortest; that is, in FIG. 6, the delay time is equal to that resulting when the clock passes through the delay unit $U_0$ alone.

Figure 16:
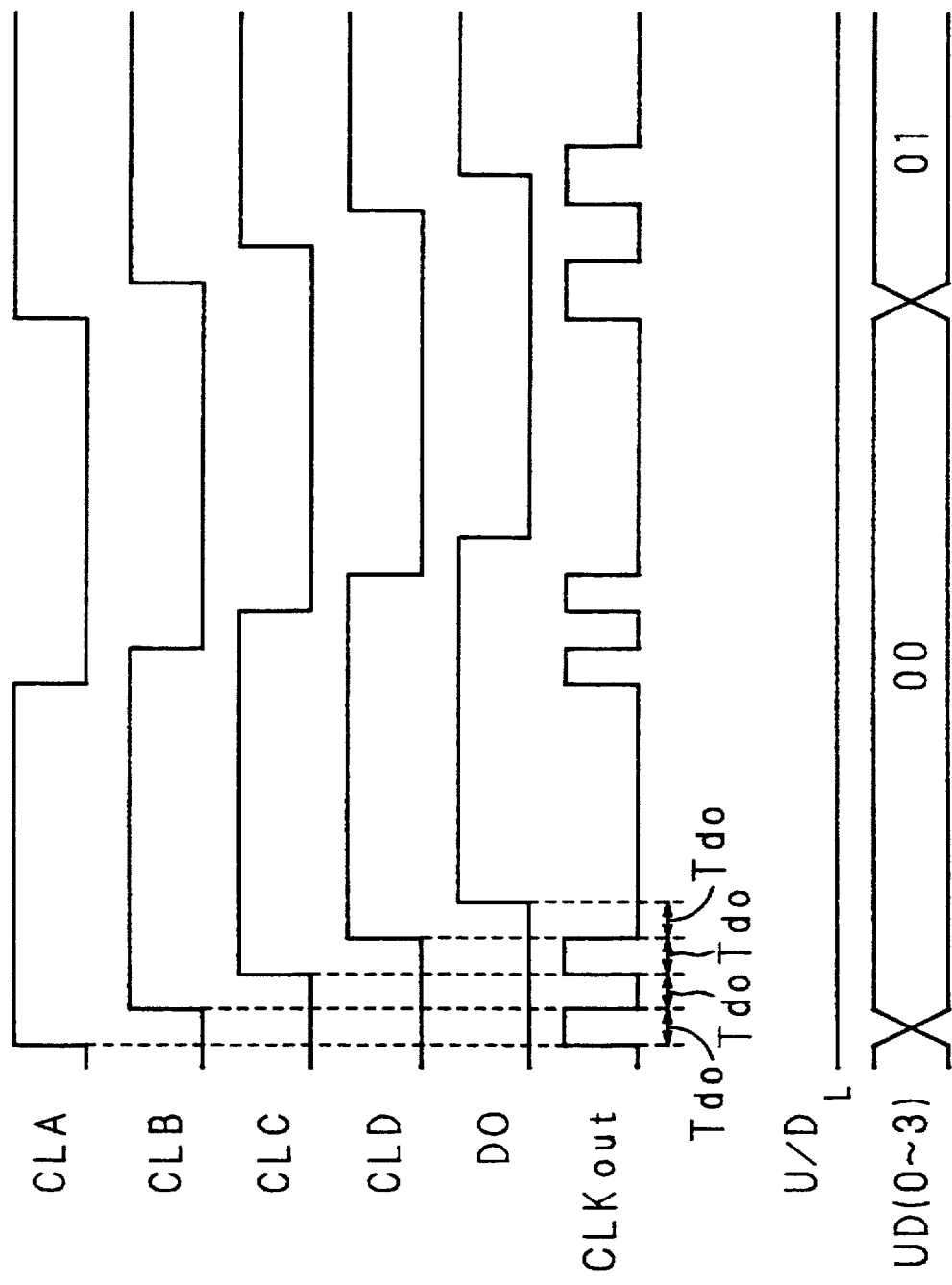
FIG. 16 is a timing chart of a clock, an up/down signal, and a count data.
Figure 17:
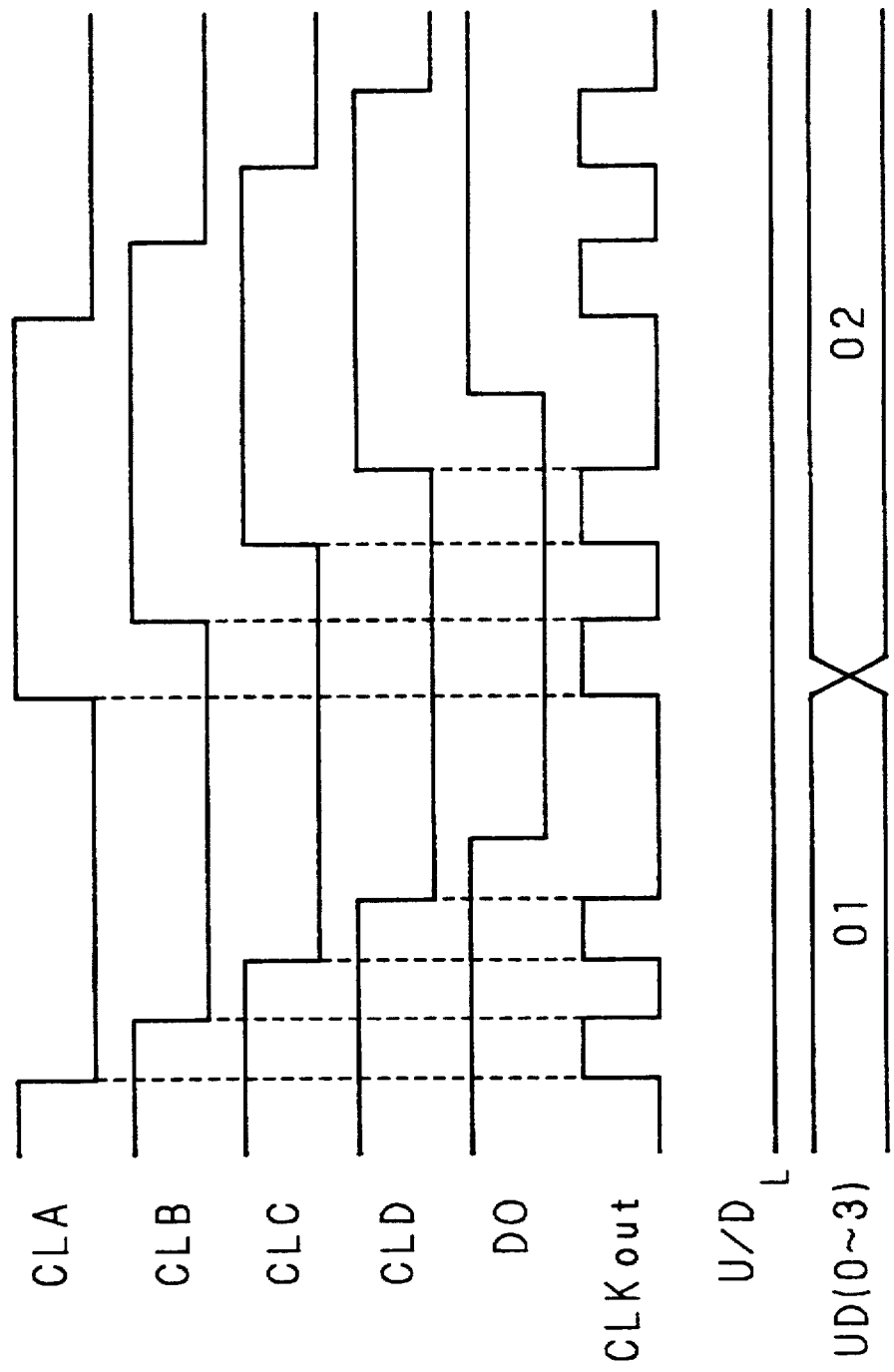
FIG. 17 is a timing chart of a clock, an up/down signal, and a count data.
Figure 18:
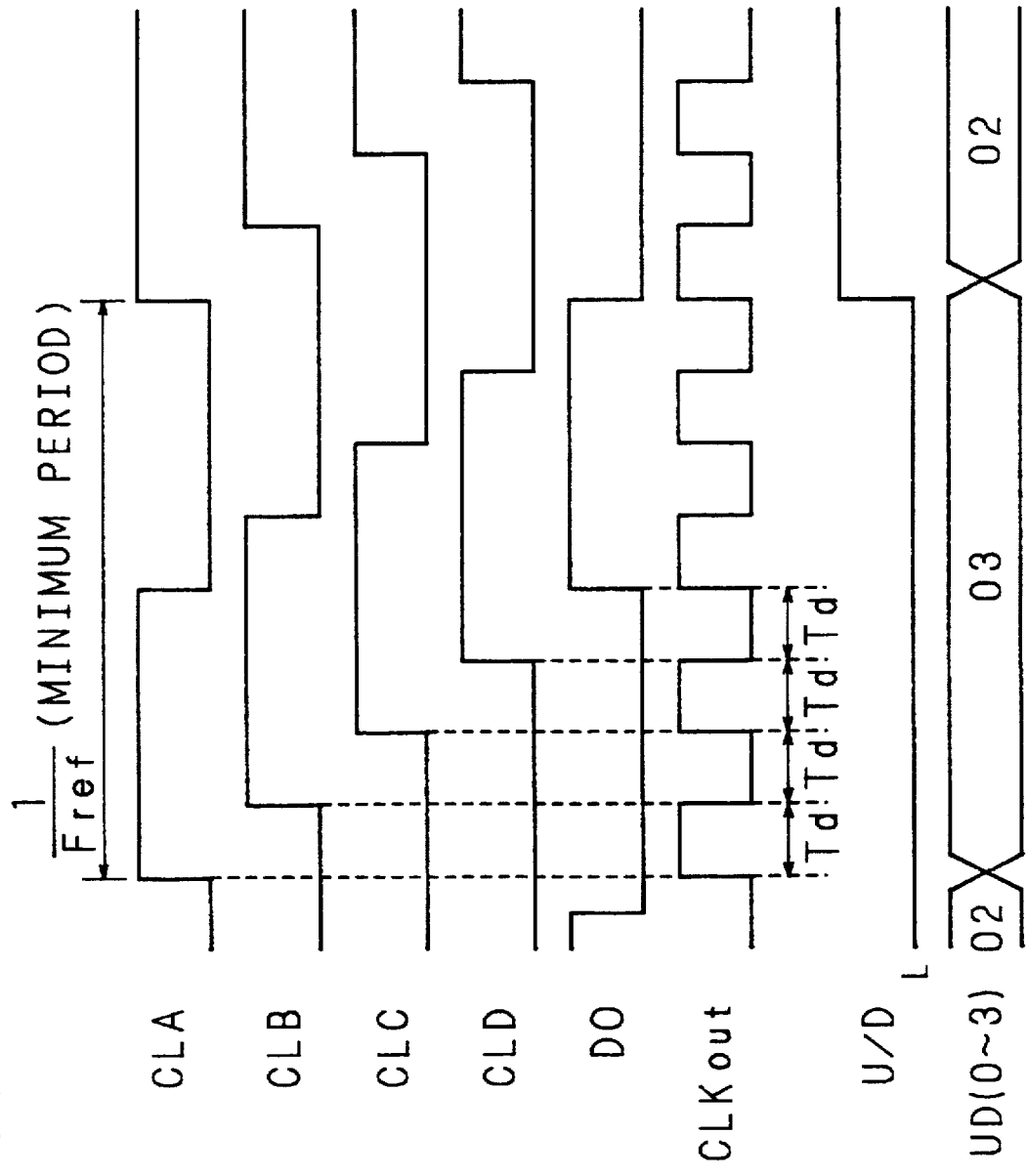
FIG. 18 is a timing chart of a clock, an up/down signal, and a count data.

When the delay time is $T_{d0}$ as shown in FIG. 16, the clock generating circuit generates a clock $CLK_{out}$ as shown in FIG. 17. At this time, an up/down signal U/D outputted by the phase comparator PD is L-level as described above, so that the value of the count data UD (0 to 3) increases by "1"

in synchronism with the subsequent clock $CLK_{in}$. The value of the count data UD (0 to 3) increases by "1", the delay time of each delay line is prolonged by that of one delay unit. The pulse width and interval of the clocks generated by the clock pulse generating circuit is prolonged but the up/down signal U/D remains L-level. The value of the count data UD (0 to 3) further increases by "1" to become "2" as shown in FIG. 18.

The up/down signal U/D remains L-level, and the count value of the up/down counter UDC further increases by "1" to become "3". In this condition, when the clock $CLK_{in}$ changes from L-level to H-level as shown in FIG. 18, the up/down signal U/D changes to H-level. As a result, the count data UD (0 to 3) of the up/down counter UDC decreases by "1" to become "2". In the next cycle of the clock $CLK_{in}$, the up/down signal U/D changes to L-level, and the value of the count data UD (0 to 3) becomes "3". In the subsequent cycles the count data UD (0 to 3) of the up/down counter UDC continues to become "2" and "3" alternately. When this state is reached, a clock having an integral multiple of the frequency of the clock $CLK_{in}$ and having a duty ratio of about 50% is generated, thereby producing a commonly called locking state.

Figure 19:
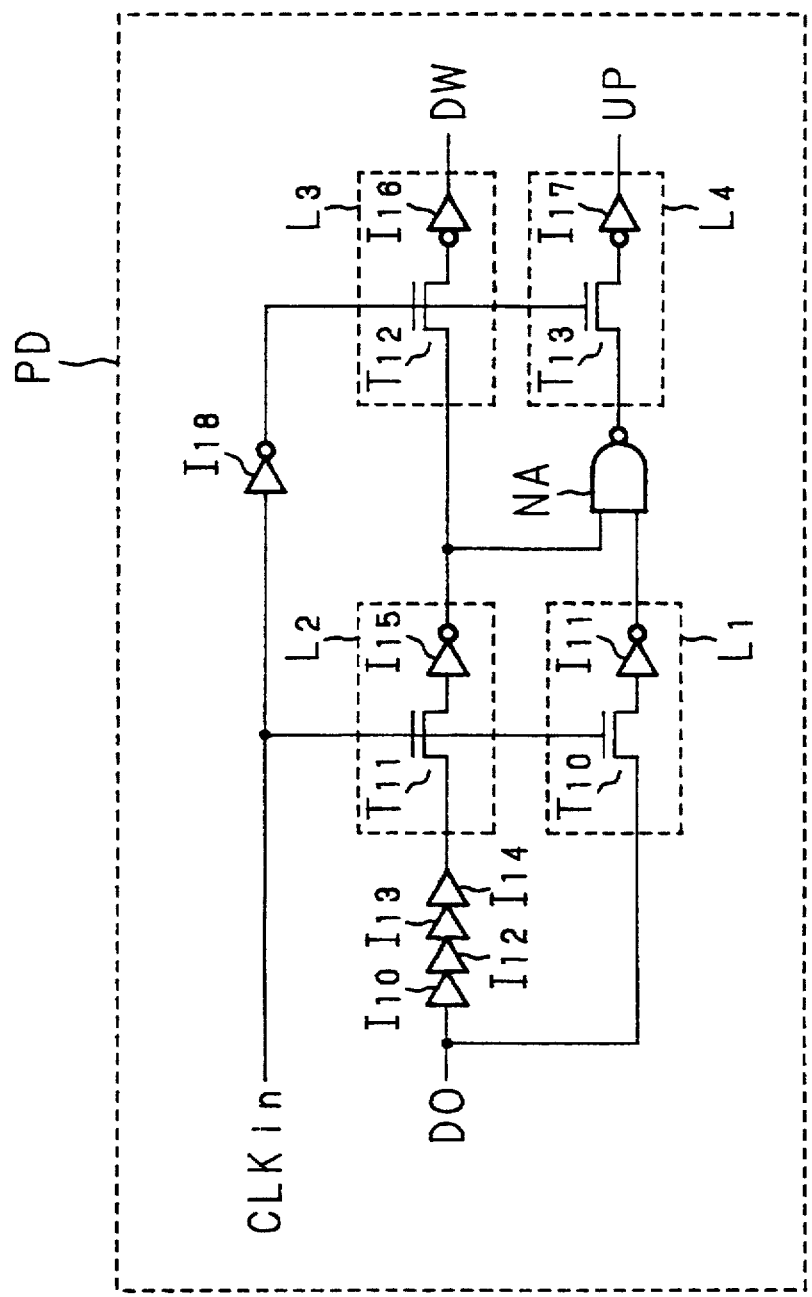
FIG. 19 is a block diagram illustrating another structure of a phase comparator.

FIG. 19 is a block diagram illustrating a modified structure of the phase comparator PD. The phase comparator PD has a terminal to which an output clock DO of the delay line DL4 in the last stage (refer to FIG. 11) is inputted, is connected to an input terminal of an inverter $I_{10}$, and to an input terminal of an inverter $I_{11}$, through a transistor $T_{10}$ of the latch circuit $L_1$. An output terminal of the inverter $I_{11}$ is connected to one input terminal of a NAND circuit NA. An output terminal of the inverter $I_{10}$ is connected to an input terminal of an inverter $I_{12}$ whose output terminal is connected to an input terminal of an inverter $I_{13}$. An output terminal of the inverter $I_{13}$ is connected to an input terminal of an inverter $I_{14}$ whose output terminal is connected to an input terminal of an inverter $I_{15}$ through a transistor $T_{11}$ of a latch circuit $L_2$. An output terminal of the inverter $I_{15}$ is connected to an input terminal of an inverter $I_{16}$ through the other input terminal of the NAND circuit NA and a transistor $T_{12}$ of the latch circuit $L_3$. The inverter $I_{16}$ outputs a down signal DW. An output terminal of the NAND circuit NA is connected to an input terminal of an inverter $I_{17}$ through a transistor $T_{13}$ of the latch circuit $L_4$. The inverter $I_{17}$ outputs an up signal UP.

The terminal receiving the clock $CLK_{in}$ is connected to the gates of the transistors $T_{10}$ and $T_{11}$, and to the gates of the transistors $T_{12}$ and $T_{13}$ through an inverter $I_{18}$. The phase comparator PD outputs both a down signal DW and an up signal UP. When the up signal UP is H-level, the count data UD (0 to 3) is increased by "1", and when the down signal DW is H-level, the count data UD (0 to 3) is decreased by "1". When both the up signal UP and the down signal DW are L-level, the up/down counter UDC retains the current count data.

If the phase comparator PD shown in FIG. 12 allows the up/down signal U/D to repeat the H-level and L-level situations alternately, the phase comparator PD of FIG. 19 allows both the up signal UP and down signal DW to become L-level. Accordingly, the value of the count data UD (0 to 3) of the up/down counter UDC settles down at a predetermined value instead of increasing and decreasing by "1" alternately. When the phase comparator PD shown in FIG. 19 is used, this situation is called a locking situation.

If the clock $CLK_{in}$ has such a high frequency that the delay time of the other gates cannot be ignored, the clock having the frequency binary-divided is supplied to the phase comparator PD so that one phase comparison may be effected each two cycles. In Embodiment 3 the 4-times multiplication of the frequency is effected. In general, the N-times multiplication can be achieved by connecting an N number of delay lines in cascade.

Embodiment 4

Figure 20:
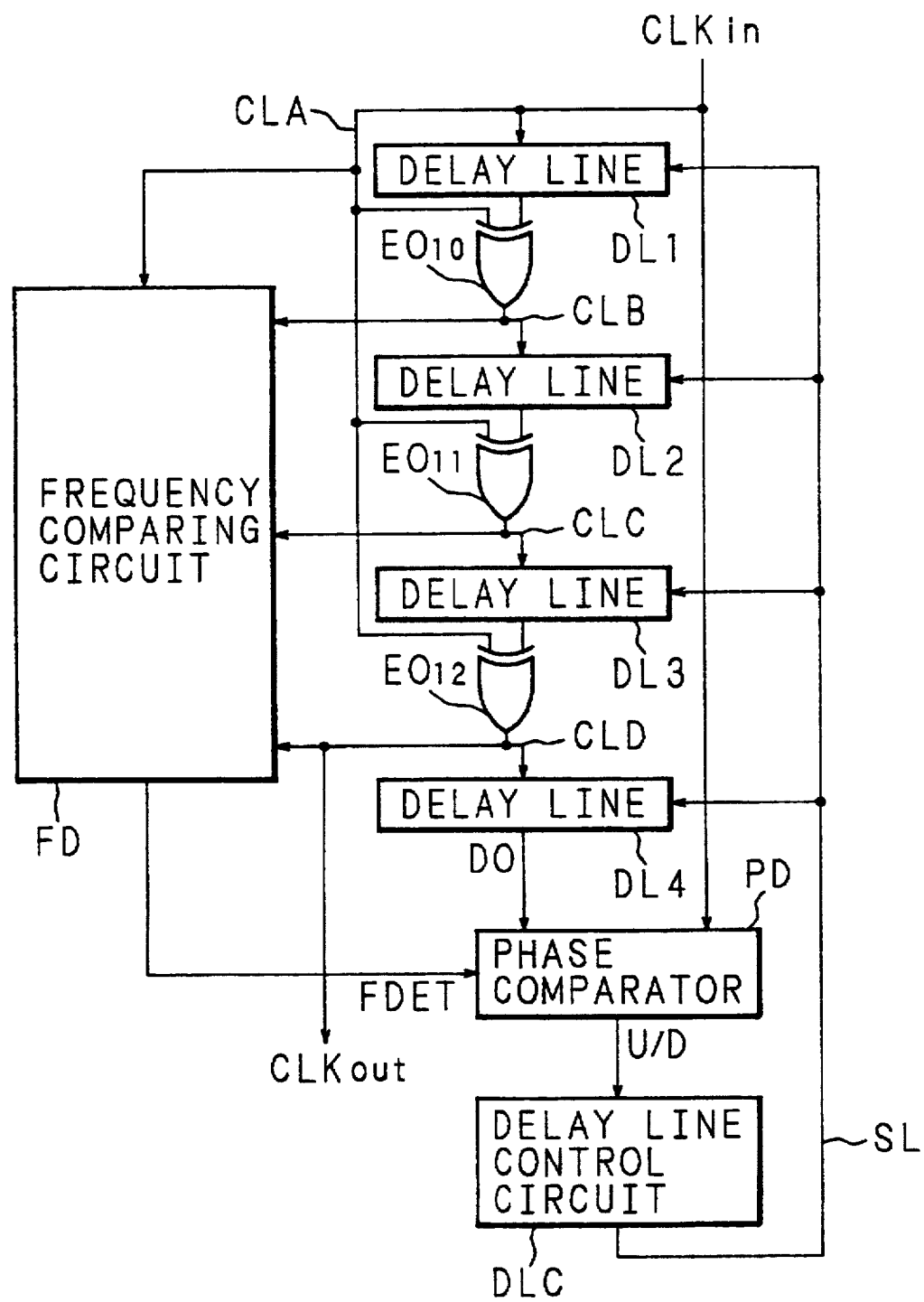
FIG. 20 is a block diagram showing a clock generating circuit according to Embodiment 4.

FIG. 20 is a block diagram showing a clock generating circuit according to Embodiment 4. A clock CLA or clock $CLK_{in}$ is inputted to a first terminal of a phase comparator PD, an input terminal of a delay line DL1, one input terminal of each of EXOR circuits $EO_{10}$, $EO_{11}$ and $EO_{12}$, and a frequency comparing circuit FD. The output clock of the delay line DL1 is inputted to the other input terminal of the EXOR circuit $EO_{10}$ which outputs a clock CLB inputted to an input terminal of a delay line DL2 and the frequency comparing circuit FD. An output clock of the delay line DL2 is inputted to the other input terminal of the EXOR circuit $EO_{11}$ whose output clock CLC is inputted to an input terminal of a delay line DL3 and the frequency comparing circuit FD.

An output clock of the delay line DL3 is inputted to the other input terminal of the EXOR circuit $EO_{12}$ whose output clock CLD is inputted to an input terminal of a delay line DL4 and the frequency comparing circuit FD. An output clock DO of the delay line DL4 is inputted to a second terminal of the phase comparator PD. A signal FDET representing the result of comparison of the frequency comparator FD is inputted to the phase comparator PD. An up/down signal U/D outputted from the phase comparing circuit FD is inputted to a delay line control circuit DLC. The delay selecting signal SL outputted from the delay line control circuit DLC is inputted to the delay selecting terminals of the delay lines DL1, DL2, DL3 and DL4. The EXOR circuit $EO_{12}$ outputs a clock having a multiplied frequency.

The delay lines DL1, DL2, DL3 and DL4 are structured in the same manner as shown in FIG. 6. The basic operation of the phase comparator PD of FIG. 20 is the same as that of the phase comparator PD of FIG. 19, but when the signal FDET representing the result of comparison is H-level, it raises the down signal DW to H-level irrespective of phases of the clock $CLK_{in}$ and the output clock DO of the delay line DL4.

Figure 21:
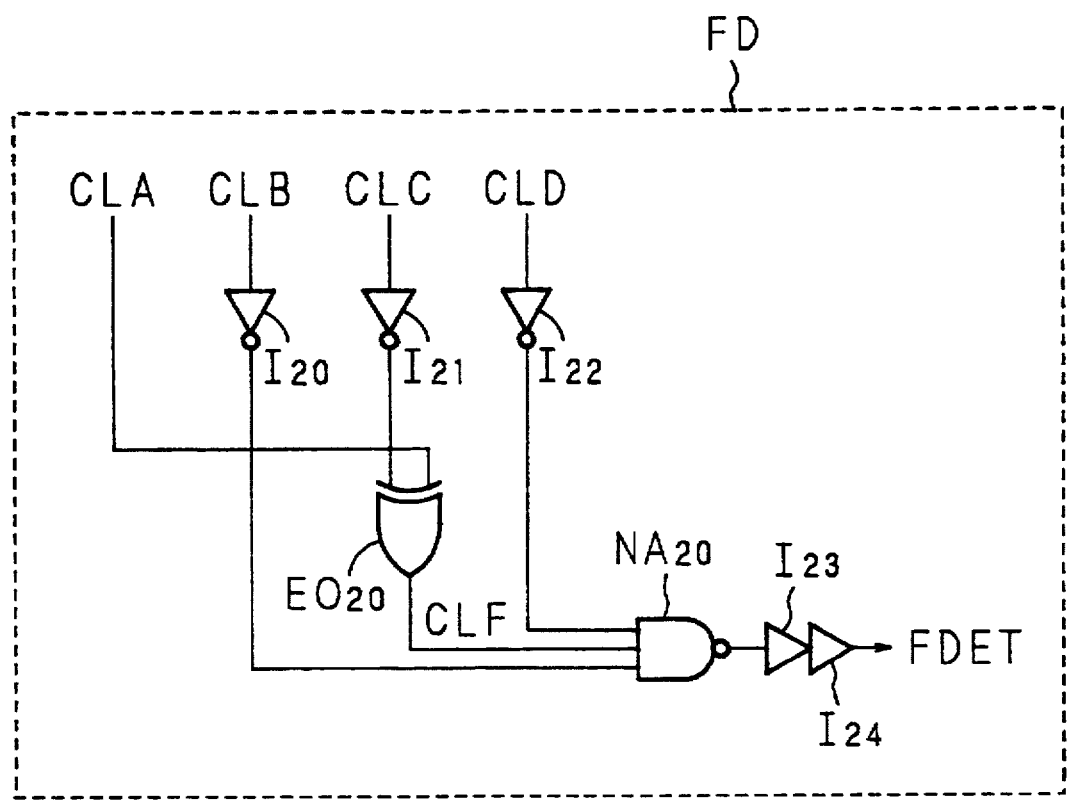
FIG. 21 is a block diagram showing a frequency comparing circuit.

FIG. 21 is a block diagram illustrating the structure of the frequency comparing circuit FD. A clock CLA inputted to the delay line DL1 is inputted to an input terminal of an EXOR circuit $EO_{20}$. An output clock CLB of the EXOR circuit $EO_{10}$ is inputted to a first input terminal of 3-inputs NAND circuit $NA_{20}$ through an inverter $I_{20}$. An output clock CLC of the EXOR circuit $EO_{11}$ is inputted to the other input terminal of the EXOR circuit $EO_{20}$ through an inverter $I_{21}$. An output clock CLF of the EXOR circuit $EO_{20}$ is inputted to a second input terminal of the 3-inputs NAND circuit $NA_{20}$. An output clock CLD of the EXOR circuit $EO_{12}$ is inputted to a third terminal of the 3-inputs NAND circuit $NA_{20}$.

Figure 22:
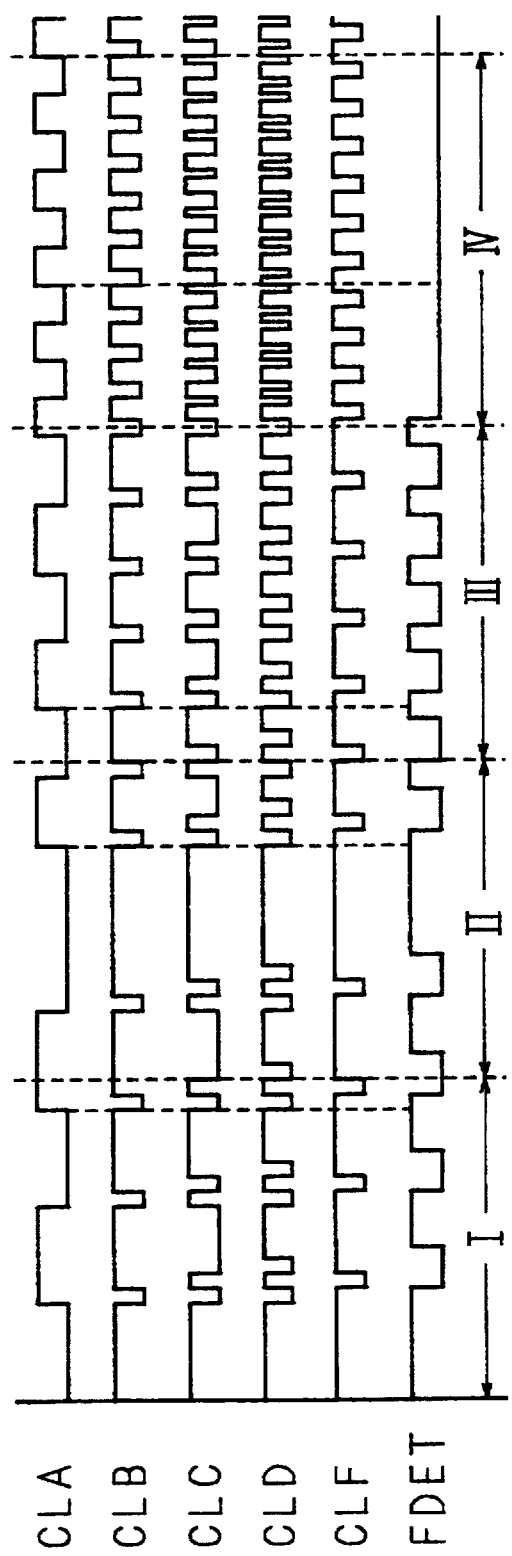
FIG. 22 is a timing chart of a clock and a lock detection signal.

An output clock of the 3-inputs NAND circuit $NA_{20}$ is inputted to an inverter $I_{24}$ through an inverter $I_{23}$, and the inverter $I_{24}$ outputs a signal FDET representing the result of comparison. The frequency comparing circuit FD outputs a signal FDET representing the result of comparison of H-level at the rising time of the clock $CLK_{in}$ during the terms I, II and III when the frequency is not multiplied by a predetermined number of times; in the present case, four times as shown in FIG. 22.

As a result, by combination of the frequency comparing circuit FD and phase comparing circuit PD, the down signal DW of the up/down signal U/D becomes H-level until the frequency of the output clock CLD reaches a desired multiplication, regardless of phases of the clock $CLK_{in}$ and the output clock DO of the delay line DL4. While the frequency of the output clock CLD reaches a predetermined multiplication, either of the up signal UP or the down signal DW becomes H-level depending upon the phase relationship between the clock $CLK_{in}$ and the output clock DO, in the same manner as the phase comparator PD shown in FIG. 19. Alternatively, both signals UP and DW become L-level. In this way, a locking situation is prevented from occurring at a smaller multiplication ratio than a predetermined number, and if the locking situation is brought into being, the frequency of the output clock $CLK_{out}$ reaches a predetermined multiplication.

Embodiment 5

Figure 23:
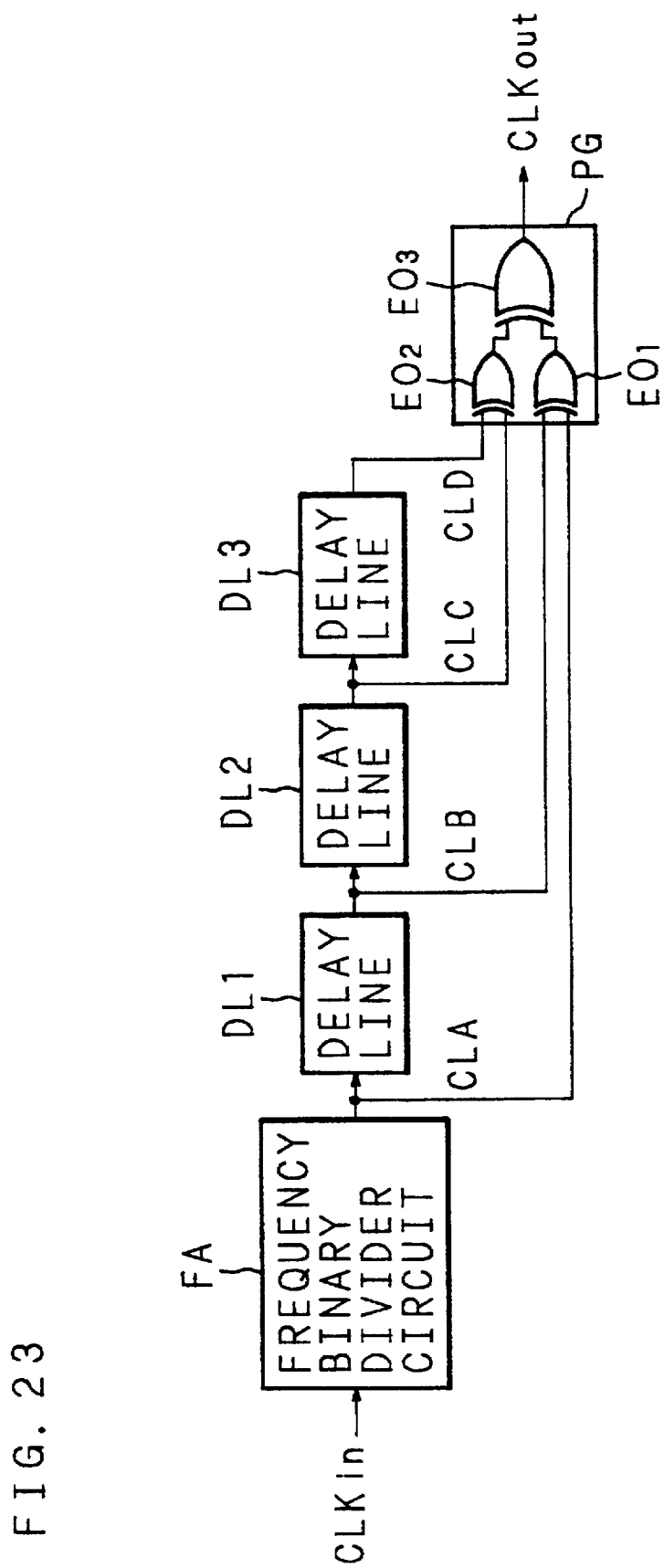
FIG. 23 is a block diagram showing a clock generating circuit according to Embodiment 5.

FIG. 23 is a block diagram showing a clock generating circuit according to Embodiment 5. A clock $CLK_{in}$ is inputted to a frequency binary divider circuit FA. A divided clock CLA is inputted to a delay line DL1. The other structure is the same as that shown in FIG. 4, wherein like reference numerals designate like components and elements to those in FIG. 23. The delay lines have the same structure as that shown in FIG. 6.

According to the clock generating circuit of Embodiment 5, the frequency binary divider circuit FA divides the frequency of the clock $CLK_{in}$ to produce a clock CLA having a 50% duty ratio without regard to the duty ratio of the clock $CLK_{in}$. The clock generating circuit successively inputs the clock CLA to the delay lines DL1, DL2 and DL3, and after allowing the same process as the case shown in FIG. 4 to follow, it finally generates a clock $CLK_{out}$ having a 50% duty ratio.

Figure 24:
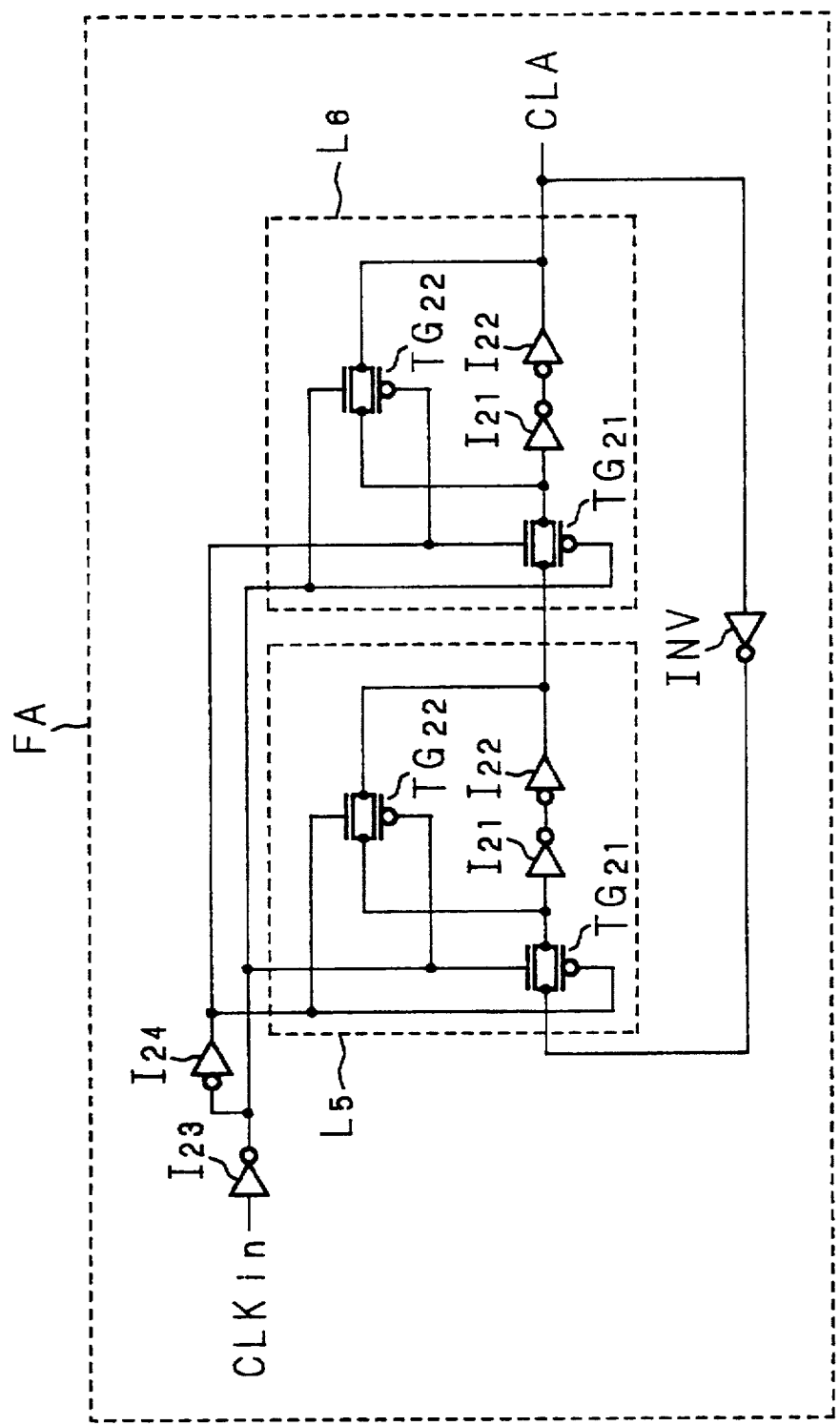
FIG. 24 is a block diagram illustrating the structure of a frequency binary divider circuit.

The frequency binary divider circuit FA is structured as shown in FIG. 24. Latch circuits $L_5$ and $L_6$ are connected in cascade, and the latch data of the latch circuit $L_6$ is inputted to the latch circuit $L_5$ through an inverter INV. Each of the latch circuits $L_5$ and $L_6$ has a transfer gate $TG_{21}$ and inverters $I_{21}$, $I_{22}$ connected in series, and another transfer gate $TG_{22}$ connected in parallel to the series connection of the inverters $I_{21}$ and $I_{22}$. A clock obtained by inverting the clock $CLK_{in}$ by an inverter $I_{23}$ to be frequency-divided is fed to an N-channel transistor of the transfer gate $TG_{21}$ in the latch circuit $L_5$, a P-channel transistor of the transfer gate $TG_{22}$ therein, a P-channel transistor of the transfer gate $TG_{21}$ in the latch circuit $L_6$, and an N-channel transistor of the transfer gate $TG_{22}$ therein. The clock inverted by the inverter $I_{23}$ is further inverted by an inverter $I_{24}$ and is fed to a P-channel transistor of the transfer gate $TG_{21}$ in the latch circuit $L_5$, an N-channel transistor of the transfer gate $TG_{22}$ therein, an N-channel transistor of the transfer gate $TG_{21}$ in the latch circuit $L_6$, and a P-channel transistor of the transfer gate $TG_{22}$ therein.

When the clock $CLK_{in}$ becomes H-level, the frequency divider circuit FA turns on the transfer gate $TG_{22}$ in the latch circuit $L_5$ and the transfer gate $TG_{21}$ in the latch circuit $L_6$, thereby allowing the clock CLA to become H-level. When the clock $CLK_{in}$ becomes L-level, the transfer gate $TG_{21}$ in the latch circuit $L_5$ and the transfer gate $TG_{22}$ in the latch circuit $L_6$ are turned on, so that the latch circuit $L_5$ latches the L-level condition inverted by an inverter INV. At this time, the transfer gate $TG_{21}$ in the latch circuit $L_6$ is off, and the clock CLA holds H-level.

When the clock $CLK_{in}$ becomes H-level, the transfer gate $TG_{21}$ of the latch circuit $L_5$ is turned off and the transfer gate $TG_{21}$ in the latch circuit $L_6$ is turned on, thereby allowing he clock CLA to be inverted into L-level. In this way, each time the clock $CLK_{in}$ is inverted into H-level, the clock CLA is inverted so that the frequency of the clock $CLK_{in}$ is divided, thereby enabling the clock CLA to have a 50% duty ratio.

Figure 25:
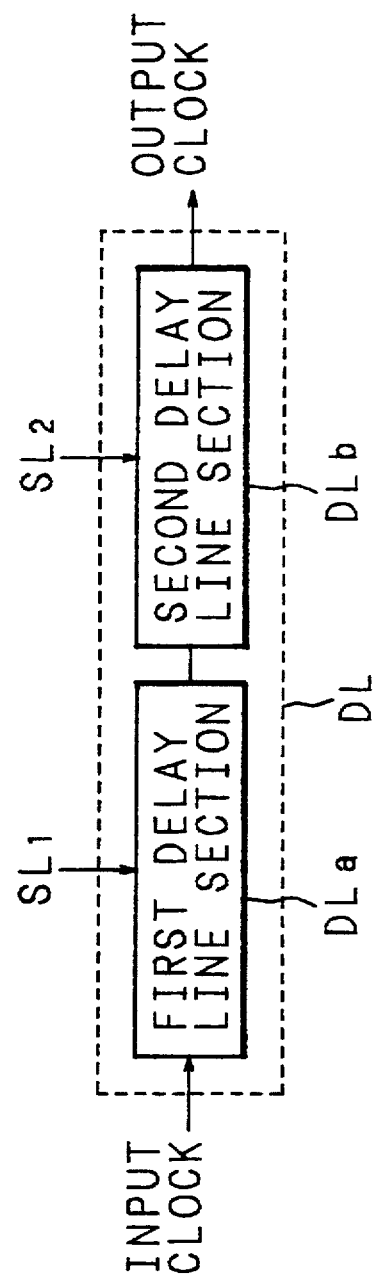
FIG. 25 is a block diagram showing another example of a delay line.

FIG. 25 is a block diagram showing a modified example of delay line. The delay line includes a first delay line section $DL_a$ and a second delay line section $DL_b$ connected in cascade. Each of the delay line sections $DL_a$ and $DL_b$ has the same structure as that of each delay line shown in FIG. 6. The delay times of the delay unit in the first delay line section $DL_a$ and of the delay unit in the second delay line section $DL_b$ are mutually differentiated; that is, it is designed such that the maximum delay time of the second delay line section $DL_b$ may be at least larger than that of the delay unit in the first delay line section $DL_a$. For example, when the delay time of the delay unit in the first delay line section $DL_a$ is 2 nsec, twenty delay units each having a delay time of 0.2 nsec may be connected in cascade for the second delay line section $DL_b$.

The operation of the delay line will be described. A first delay selecting signal $SL_1$ sets a delay time for the first delay line section $DL_a$. When the delay time of the delay unit in the first delay line section $DL_a$ is 2 nsec, it is possible to select an input-to-output delay time in the first delay line section $DL_a$ with the time width of 2 nsec by the first delay selecting signal $SL_1$.

A second delay selecting signal $SL_2$ sets a delay time for the second delay line section $DL_b$. The delay time of the delay unit constituting the second delay line section $DL_b$ is 0.2 nsec, and therefore, it is possible to select an input-to-output delay time in the second delay line section $DL_b$ with the time width of 0.2 nsec.

Consequently, when the whole delay line DL is considered, a delay time falling within the sum of the maximum delay times achievable in each of the first delay line section $DL_a$ and the second delay line section $DL_b$ can be caused to occur with the width of the delay time of the second delay line section $DL_b$. For example, suppose that forty delay units connected in cascade, and a delay time occurring in gates other than those in the delay units be ignored, it is possible to provide a delay time falling in the range of 0(zero)nset to 82 nsec at maximum and having the time width of 0.2 nsec.

If a delay time having the same time range as referred to above is caused to occur by use of single delay unit, it will be required to connect delay units each having a delay time of 0.2 nsec in 410 stacks of cascade. However, the use of two delay line sections which have mutually different time widths can reduce the circuit scale for the delay lines.

Embodiment 6

Figure 26:
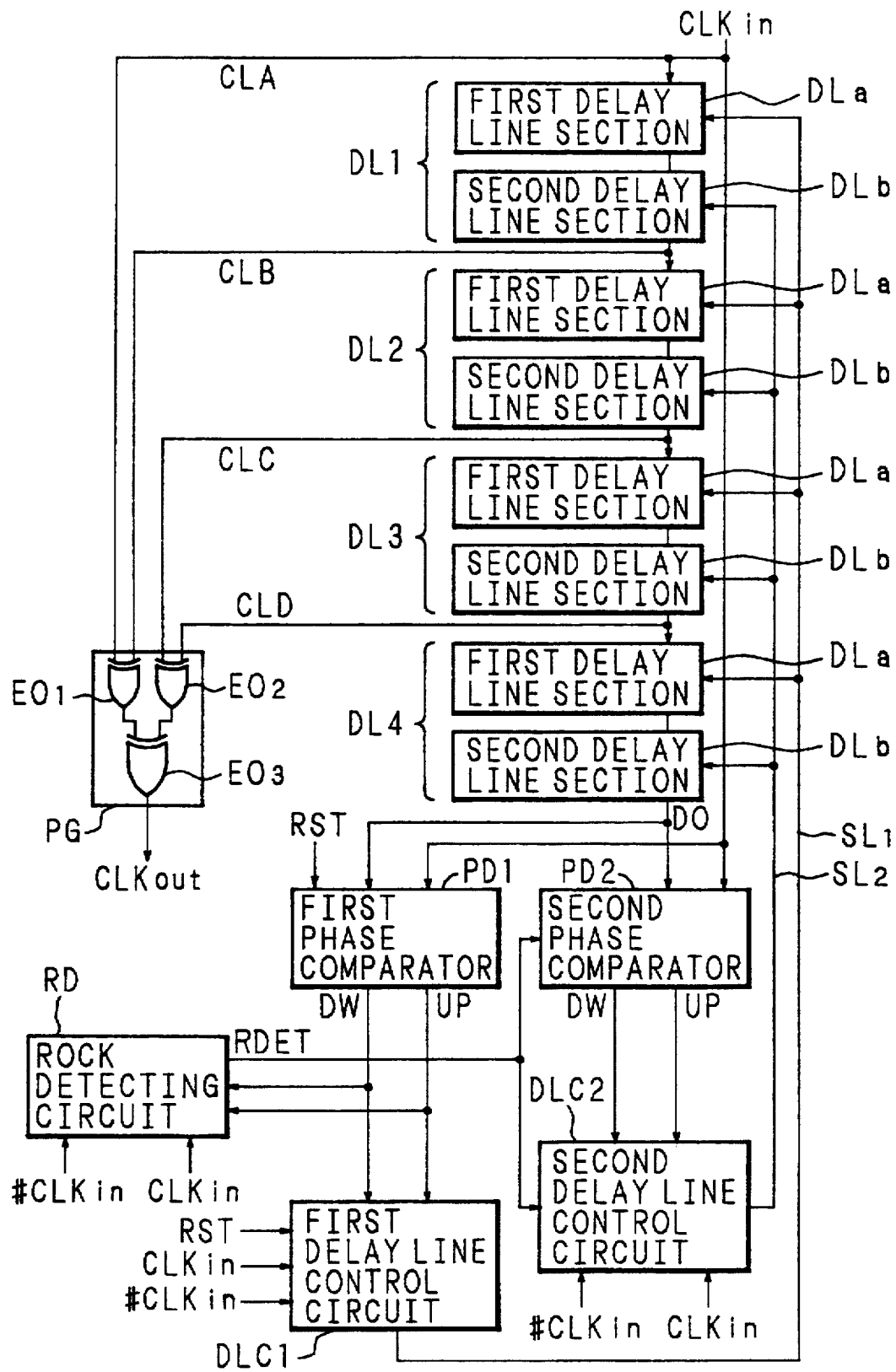
FIG. 26 is a block diagram showing a clock generating circuit according to Embodiment 6.

FIG. 26 is a block diagram showing a clock generating circuit according to Embodiment 6. Each of the delay lines DL1, DL2, DL3 and DL4 corresponds to the delay line DL shown in FIG. 25, each including a first delay line section $DL_a$ and a second delay line section $DL_b$. The first delay line section $DL_a$ and the second delay line section $DL_b$ whose delay times have mutually different time widths are connected in cascade. In the illustrated example the delay time of the delay unit in the delay line section $DL_a$ is set to be equal to the maximum delay time achievable in the second delay line section $DL_b$.

The clock $CLK_{in}$ is inputted to each first terminal of a first phase comparator PD1 and a second phase comparator PD2, the delay line DL1 and one of the input terminals an EXOR circuit $E0_1$ in a pulse generating circuit PG.

A clock $CLK_{in}$ inputted to the delay line DL1 is inputted to each second input terminal of the first phase comparator PD1 and the second phase comparator PD2 through the delay lines DL2, DL3 and DL4. An up/down signal U/D outputted from the first phase comparator PD1 is inputted to a lock detecting circuit RD and the first delay line control circuit DLC1 which outputs a delay selecting signal $SL_1$ is inputted to each first delay line section DLa in the delay lines DL1, DL2, DL3 and $DL4_a$.

A lock detecting signal RDET outputted from the lock detecting circuit RD is inputted to the second phase comparator PD2 and the first delay line control circuit DLC2 as a control signal. An up/down signal U/D outputted from the second phase comparator PD2 is inputted to the second delay line control circuit DLC2. The second delay line control circuit DLC2 outputs a delay selecting signal $SL_2$ which is inputted to each second delay line section $DL_b$ of the delay lines DL1, DL2, DL3 and DL4. An output clock CLB of the delay line DL1 is inputted to the other input terminal of the EXOR circuit $E0_1$ in the pulse generating circuit PG, an output clock CLC of the delay line DL2 is inputted to one input terminal of the EXOR circuit $E0_2$, and an output clock CLD of the delay line DL3 is inputted to the other input terminal of the EXOR circuit $E0_2$. The output clocks of the EXOR circuits $E0_1$, and $E0_2$ are inputted to the respective input terminals of an EXOR circuit $E0_3$ which outputs a clock $CLK_{out}$.

The clock $CLK_{in}$ and its inverted clock $\#CLK_{in}$ are inputted to the first and second delay line control circuits DLC1, DLC2 and the lock detecting circuit RD. A reset signal RST is inputted to the first delay line control circuit DLC1.

Figure 27:
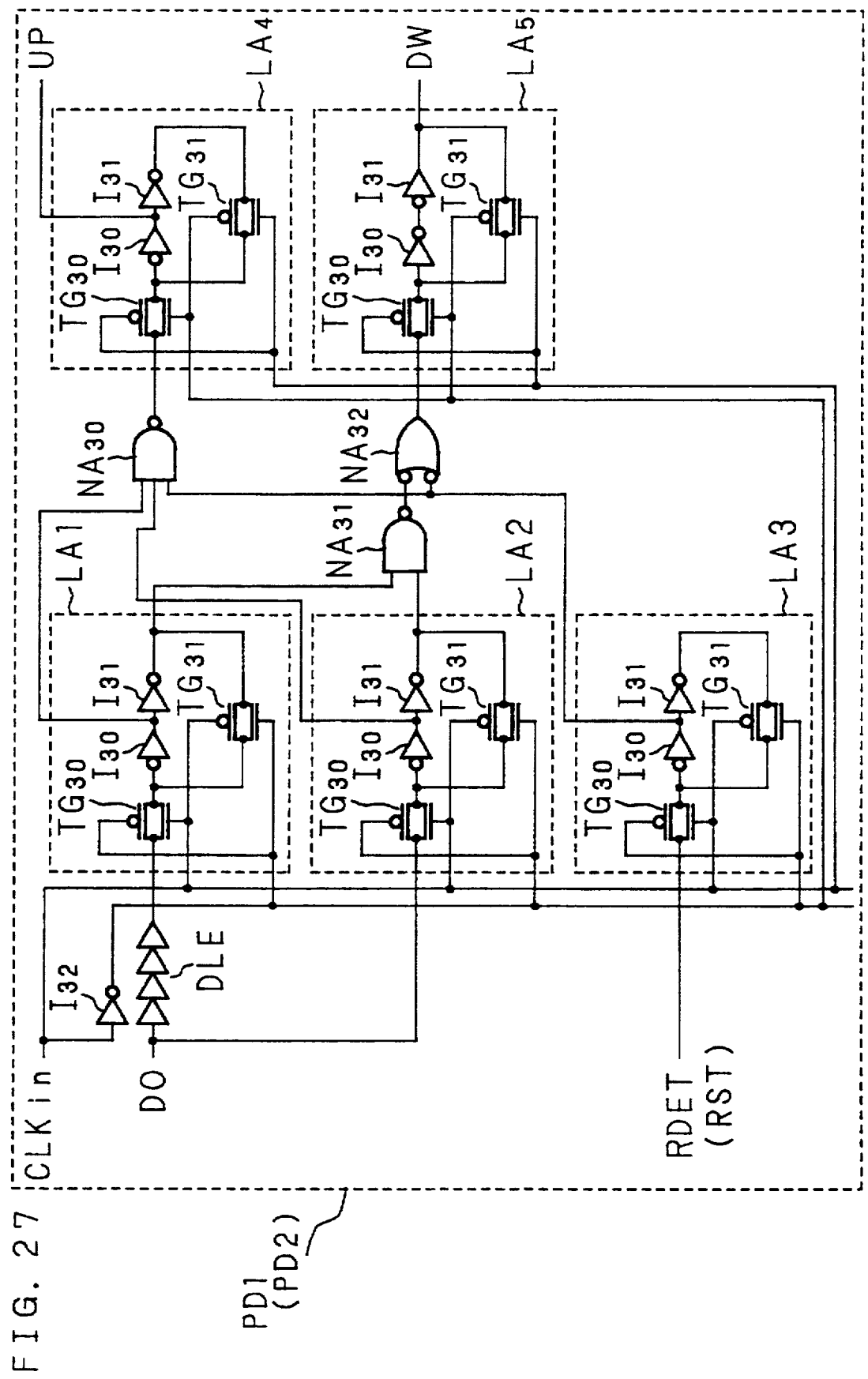
FIG. 27 is a block diagram illustrating the structure of a phase comparator.

FIG. 27 is a block diagram illustrating the structure of the phase comparators PD1 and PD2. Each of latch circuits LA1, LA2, LA3, LA4 and LA5 is provided with a series connection of a transfer gate $TG_{30}$, inverters $I_{30}$ and $I_{31}$, and a transfer gate $TG_{31}$ connected in parallel to the series connection of the inverters $I_{30}$ and $I_{31}$. An inverted clock $\#CLK_{in}$ obtained by inverting a clock $CLK_{in}$ by the inverter $I_{32}$ is fed to the transfer gates $TG_{30}$ and $TG_{31}$ of each of the latch circuits LA1, LA2, LA3, LA4 and LA5 as an on/off signal. An output clock DO of the delay line 4 (refer to FIG. 26) is inputted to the transfer gate $TG_{30}$ of the latch circuit LA1 through a delay element DLE constituted by four inverters connected in series, and is inputted directly to the transfer gate $TG_{30}$ of the latch circuit LA2.

The lock detecting circuit RD (refer to FIG. 26) outputs a lock detect signal RDET which is inputted to the transfer gate $TG_{30}$ of the latch circuit LA3. The outputs of the respective inverters $I_{30}$ of the latch circuits LA1, LA2, and LA3 are inputted to a first, second and third input terminal of a 3-inputs NAND circuit $NA_{30}$, respectively. The output of the inverter $I_{30}$ of the latch circuit LA3 is inputted to one input terminal of a NAND circuit $NA_{32}$. The outputs of the respective inverters $I_{31}$ of the latch circuits LA1 and LA2 are inputted to the respective input terminals of a NAND circuit $NA_{31}$.

The output of the NAND circuit $NA_{31}$ is inputted to the other input terminal of the NAND circuit $NA_{32}$. The output of the NAND circuit $NA_{30}$ is inputted to the transfer gate $TG_{30}$ of the latch circuit LA4, and the output of the inverter $I_{30}$ is outputted as an up signal UP. The output of the NAND $NA_{32}$ is inputted to the transfer gate $TG_{30}$ of the latch circuit LA5, thereby outputting the output of the inverter $I_{31}$ as a down signal DW.

Each delay element DLE for the phase comparators PD1 and PD2 is provided with at least two delay units in the first delay line section $DL_a$ and in the second delay line section $DL_b$ connected in cascade so as to vary the detecting sensitivity to a phase difference between the phase comparators PD1 and PD2. When the delay time of the delay unit in the first delay line section $DL_a$ is 2 nsec, and the delay time of the delay unit in the second delay line section $DL_b$ is 0.2 nsec, the first phase comparator PD1 does not respond to a phase difference of ±2 nsec. The second phase comparator PD2 can detect a phase difference of at least ±0.2 nsec, and generate the up/down signal U/D.

The delay line control circuits DLC1 and DLC2 may be structured as shown in FIG. 15, and alternatively it may be structured so as to receive a lock detecting signal RDET. In this case, when the lock detecting signal RDET is L-level, a predetermined value is outputted as a delay selecting signal. If the lock detecting signal RDET is H-level, the value of the delay selecting signal $SL_2$ is increased or decreased by an up/down signal U/D of the second phase comparator PD2.

The predetermined value referred to above may be a value at which a delay time of half (½) of the maximum delay time achievable, for example, by the second delay line section $DL_b$ can be selected. The delay line control circuit constructed in this way includes an up/down counter structured as shown in FIG. 27, and a decoder circuit which outputs one of the delay selecting signals in the delay line in accordance with the count data of the up/down counter as shown in FIG. 15.

Figure 28:
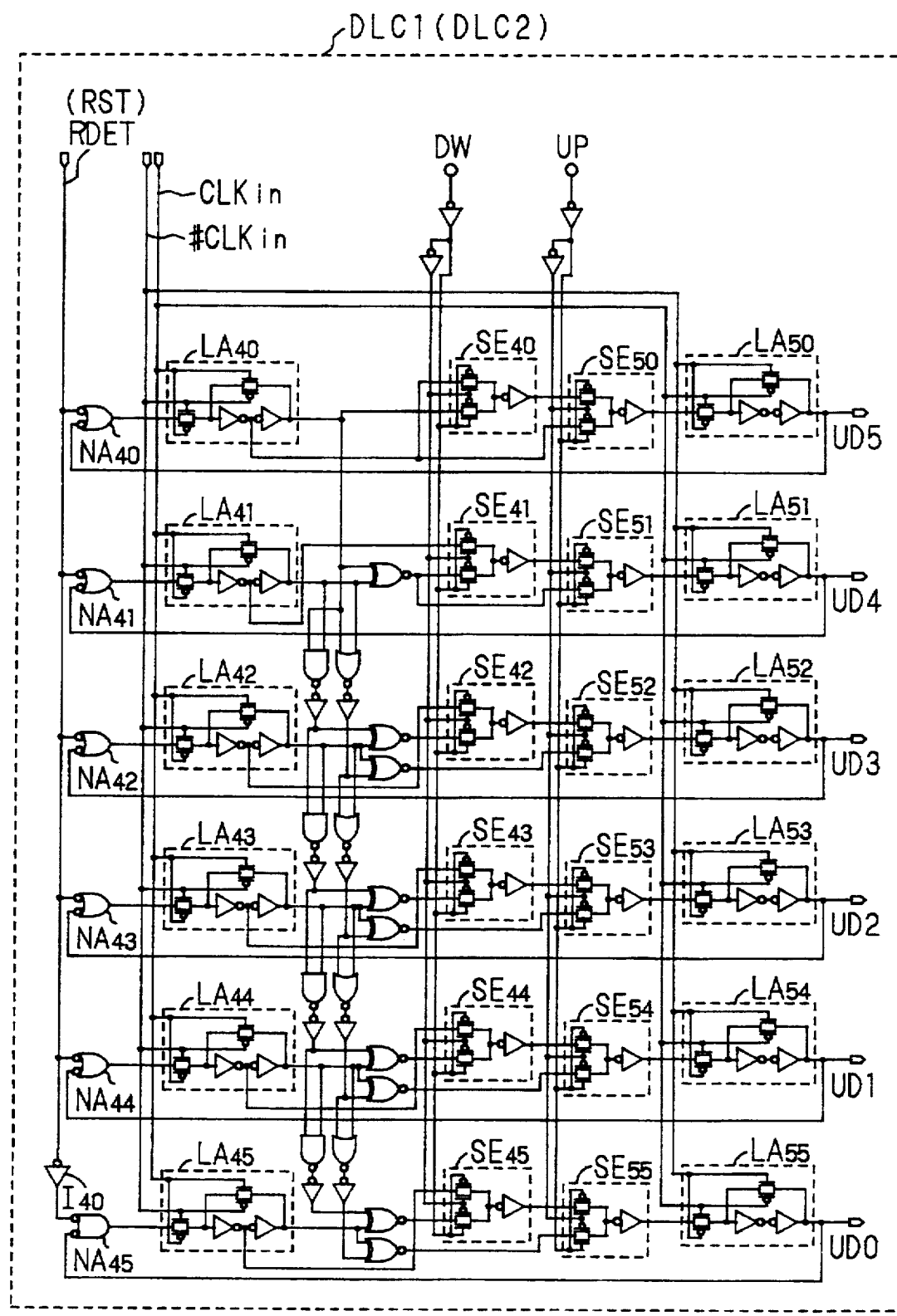
FIG. 28 is a block diagram illustrating the structure of a delay line control circuit.

FIG. 28 is a block diagram illustrating the structure of the delay line control circuit DLC1 or DLC2. The circuit includes latch circuits $LA_{40}$, $LA_{41}$, $LA_{42}$, $LA_{43}$, $LA_{44}$, and $LA_{45}$ which latch the reset signal RST or lock detecting signal RDET in synchronism with the clock $CLK_{in}$ and inverted clock $\#CLK_{in}$, selecting circuits $SE_{40}$, $SE_{41}$, $SE_{42}$, $SE_{43}$, $SE_{44}$, $SE_{45}$, $SE_{50}$, $SE_{51}$, $SE_{52}$, $SE_{53}$, $SE_{54}$ and $SE_{55}$ which select one from among latch data of the latch circuits $LA_{40}$, $LA_{41}$, $LA_{42}$, $LA_{43}$, $LA_{44}$ and $LA_{45}$ and inverted latch data on the basis of the down signal DW and up signal UP, latch circuits $LA_{50}$, $LA_{51}$, $LA_{52}$, $LA_{53}$, $LA_{54}$ and $LA_{55}$ which latch selected data in synchronism with the clock $CLK_{in}$ and inverted clock $\#CLK_{in}$, and a number of logic circuits.

Figure 29:
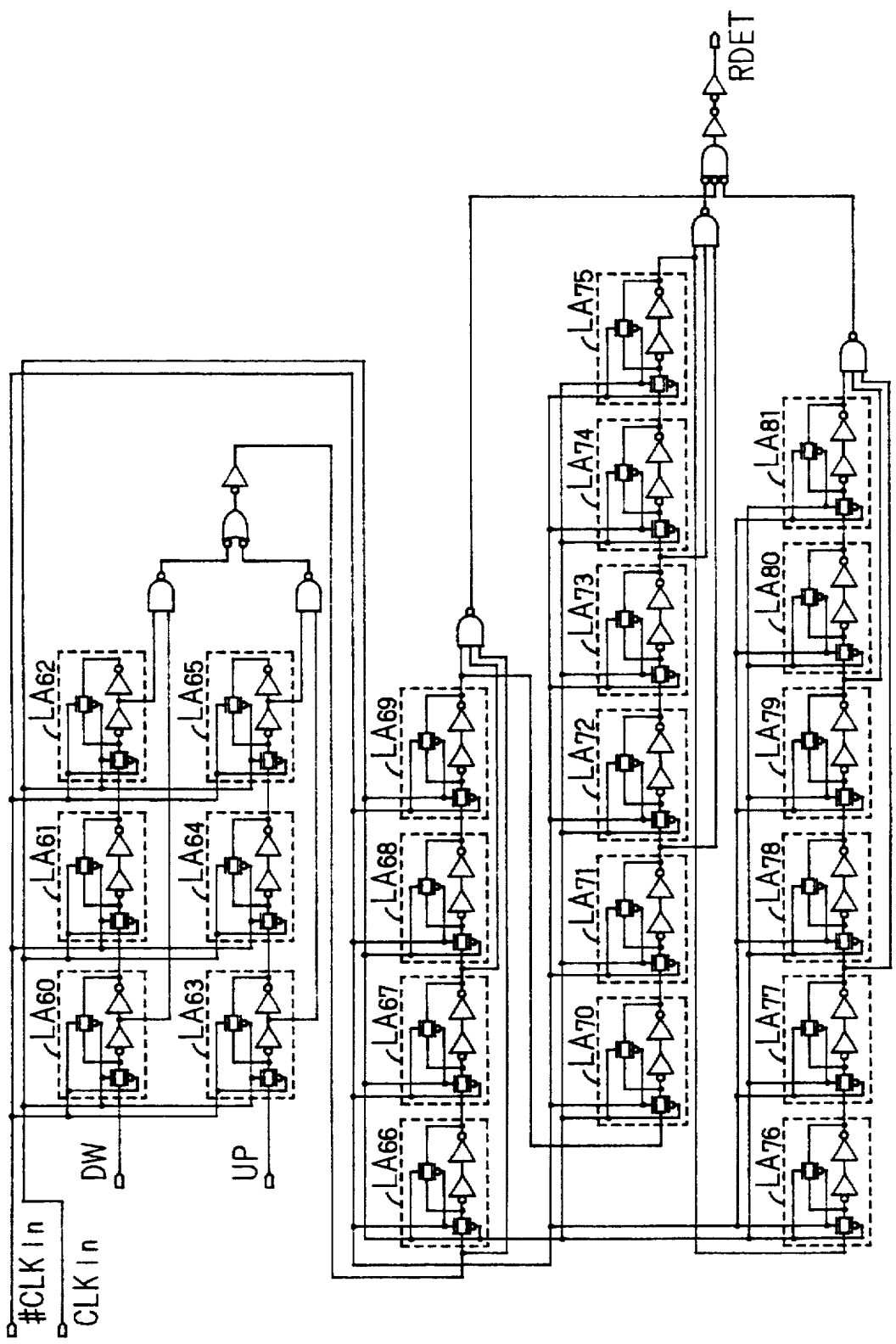
FIG. 29 is a block diagram illustrating the structure of a lock detecting circuit.

FIG. 29 is a block diagram illustrating the structure of the lock detecting circuit RD. The lock detecting circuit RD includes latch circuits $LA_{60}$, $LA_{61}$ and $LA_{62}$ connected in cascade which latch the down signal DW in synchronism with the clock $CLK_{in}$ and an inverted clock $\#CLK_{in}$, latch circuits $LA_{63}$, $LA_{64}$ and $LA_{65}$ connected in cascade which latch the up signal UP in synchronism with the clock $CLK_{in}$, and the inverted clock $\#CLK_{in}$, latch circuits $LA_{66}$, $LA_{67}$, $LA_{68}$, $LA_{69}$, $LA_{70}$, $LA_{71}$, $LA_{72}$, $LA_{73}$, $LA_{74}$ and $LA_{75}$ connected in cascade which latch data based on the logic of latch data of the latch circuits $LA_{62}$ and $LA_{65}$, and latch circuits $LA_{76}$, $LA_{77}$, $LA_{78}$, $LA_{79}$, $LA_{80}$, and $LA_{81}$ connected in cascade which latch the latch data of the latch circuit $LA_{75}$.

The lock detecting circuit RD is designed so as to output a lock detecting signal RDET of H-level during the two cycles of the clock $CLK_{in}$ when a situation where the phase comparators PD1 and PD2 continue to generate neither up signal UP nor down signal DW over nine cycles or more.

The operation of the clock generating circuit referred to above is described:

A reset signal RST resets the first delay line control circuit DLC1, and then becomes H-level. The first delay line control circuit DLC1 is ready to operate. In the initial state the phases of the clock $CLK_{in}$ and the output clock DO of the delay line DL4 are greatly differentiated, and both of the first and second phase comparators PD1 and PD2 raise the up signal UP and down signal DW to H-level. When the lock detecting circuit RD detects that the output clock DO is not in the lock condition, the lock detecting signal RDET becomes L-level.

In this way, the second delay line control circuit DLC2 fixes the delay selecting signal $SL_2$ of the second delay line section $DL_b$ to a predetermined value, preferably a value at which a delay time of half (½) of the maximum delay time achievable by the second delay line section $DL_b$ can be selected. The output clock DO gradually comes into the lock condition in the manner as described above.

When the first phase comparator PD1 detects less sensitive to a possible phase difference, a phase difference of ±2 nsec at maximum is likely to occur. In contrast, Embodiment 6 allows a phase difference between the clock $CLK_{in}$ and the output clock DO to fall within ±0.2 nsec by locking the output clock DO as follows. More specifically, when the lock detecting circuit RD detects that the output clock DO reaches the lock condition owing to the delay effected by the first delay line section $DL_a$, the lock detecting signal RDET becomes H-level. Thus the output clock DO comes into the lock condition through the second delay line section $DL_b$ selected by the delay selecting signal $SL_2$ and the first delay line section $DL_a$.

The phase synchronizing circuit constructed above makes it possible to achieve the lock condition which a smaller number of circuitry elements, and the clock generating circuit has a wide range of a multiplied frequency.

The method for determining the number of delay units connected in cascade in each of the delay lines. Because of the irregularity of quality semiconductor device occurring in the manufacturing process, a transmission delay of integrated gate circuits varies with each of manufacturing lots and/or each chip. In addition, the operating stability of semiconductor integrated circuits is guaranteed within a predetermined source voltage and ambient temperature but depending upon the property of the semiconductor circuit and/or changes in the source voltage and ambient temperatures, the transmission delay time of the integrated circuit changes.

Figure 30:
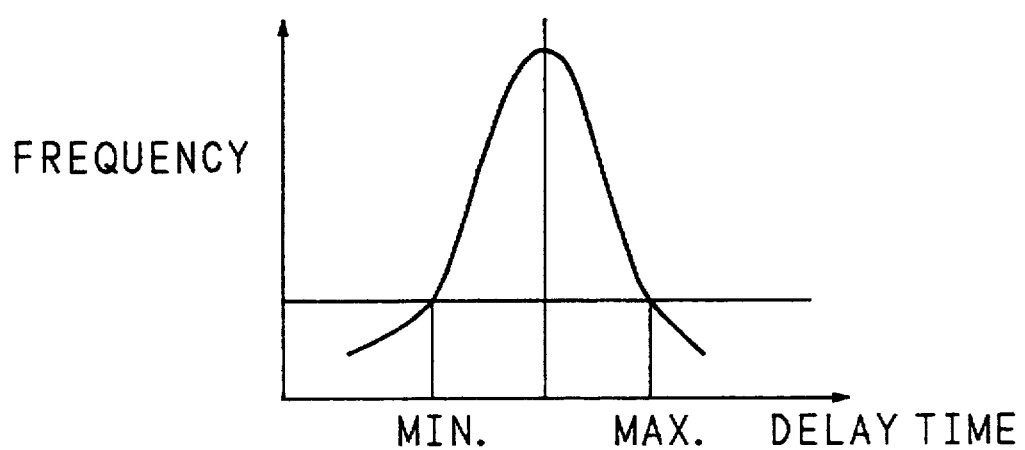
FIG. 30 is a distribution curve diagram showing the distribution of delay time determined in accordance with the process of making the semiconductor device and the ambient temperatures.

The following is to describe a method for constructing a delay line wherein the delay time is adjustable so as to enable a clock falling within a predetermined range of frequency to come into the lock condition even when it is under the above-mentioned conditions. More specifically, when the lowermost frequency of the clock inputted to the clock generating circuit is determined, a preferred number of delay units connected in cascade in the delay line shown in FIG. 6 cascade connection will be described:

Because of a possible irregularity in the manufacture of semiconductor devices, the transmission delay time of a delay unit varies as shown in FIG. 30. In the graph of FIG. 30 the horizontal axis represents the delay time, and the vertical axis represents the measuring frequency (times). The optimum upper and lower limits of delay time are determined in accordance with the kinds of semiconductor device to be manufactured. The upper and lower limits depend upon the source voltage (e.g. 3V) and ambient temperature (e.g. 27° C.), and vary depending upon the kinds of semiconductor device and manufacturing process. Therefore, the particular values of them cannot be determined. In addition, the ranges of operating source voltages (e.g. 2.7 to 3.6 V) and of operating ambient temperatures (e.g. 0° to 100° C.) are determined depending upon the kinds of semiconductor device. The values of these ranges cannot be specifically determined in this specification so long as the kinds of semiconductor device and the manufacturing process are not specified.

When these conditions are determined, the minimum delay time is sought for a particular delay unit by taking into consideration a possible irregularity occurring in the manufacturing process within the ranges of operating source voltages and ambient temperatures. For example, in the case of CMOS circuits the minimum delay time is obtained when the source voltage is the upper limit for the operating source voltage, and the ambient temperature is the lower limit for the operating ambient temperature, so the minimum delay time is designated as $T_{dmin}$. An invariable portion, e.g. the clock in FIG. 6 of the delay time generated by the delay line whose delay time is variable e.g. a delay time required to transmit each delay unit has the minimum value under the same conditions, so this minimum delay time is designated as $T_{mul}$.

Furthermore, when it is presumed that the lower limit of the frequency of a clock to be multiplied be $F_{ref}$ and the number of multiplication of the frequency be N, the maximum delay time required for a delay line where the delay time is variable is expressed as follows:

$$1/(2 \cdot N \cdot F_{ref}) \tag{1}$$

The delay time obtained from the delay line allowing of a variable delay time is the sum of a variable portion and a non-variable portion $T_{dmin}$. Therefore, the maximum delay time required as a variable delay time is expressed as follows:

$$1/(2 \cdot N \cdot F_{ref}) - T_{mul} \tag{2}$$

Therefore, the number of delay units to be connected in cascade should satisfy at least the following equation:

$$[\{1/(2 \cdot N \cdot F_{ref}) - T_{mul}\}]/T_{dmin} \tag{3}$$

For example, in FIG. 18, if it is presumed that the lowermost frequency is 10 MHz, the maximum delay time required for one delay line having a variable delay time is 12.5 nsec in the example where the number of multiplication is four. When it is presumed that the minimum delay time $T_{dmin}$ is 0.2 nsec, it is required to connect at least 63 stacks of delay units in cascade.

If it is further presumed that the upper limit of the frequency of a clock to be multiplied is $F_{max}$, the minimum value $T_{mul}$ of a non-variable delay time required for transmitting the clock through each delay unit must satisfy the following equation:

$$[\{1/(2 \cdot N \cdot F_{max}) - T_{mul}\}] > 0 \tag{4}$$

Embodiment 7

Figure 31:
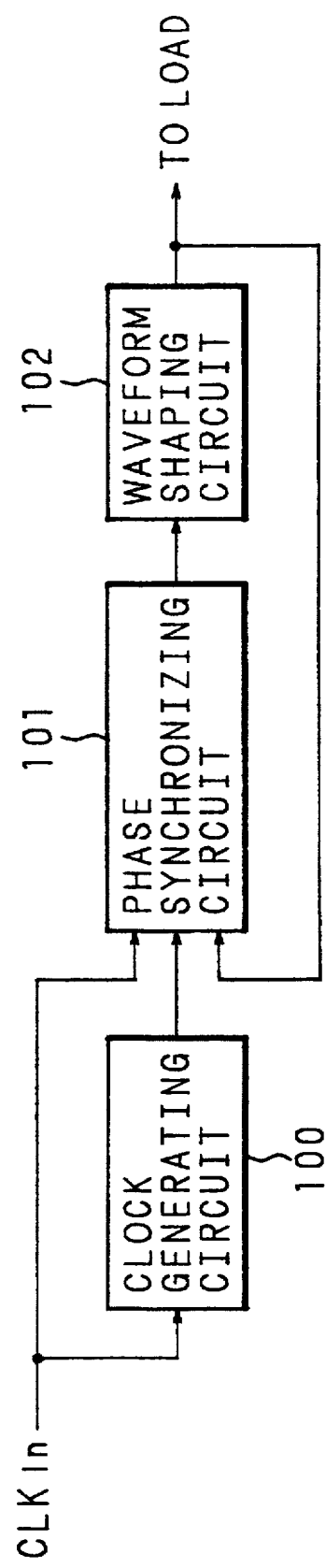
FIG. 31 is a block diagram showing the PLL circuit according to Embodiment 7.

FIG. 31 is a block diagram illustrating the structure of a PLL circuit according to Embodiment 7. A clock multiplied by a clock generating circuit 100 is inputted to a known phase synchronizing circuit 101. The output clock of the phase synchronizing circuit 101 is inputted to a known waveform shaping circuit 102 whose output clock is inputted the phase synchronizing circuit 101. A clock $CLK_{in}$ whose frequency is to be multiplied is inputted to the clock generating circuit 100 and the phase synchronizing circuit 101. The clock generating circuit 100 has the same structure as that of the clock generating circuit shown in FIG. 11.

The operation of the PLL circuit is described. When the clock $CLK_{in}$ is inputted to the clock generating circuit 100, it generates a clock having a frequency obtained by multiplying the frequency of the clock $CLK_{in}$ in the aforementioned manner. The generated clock is in the lock condition. In this state a clock having a frequency obtained by multiplying the frequency of the clock $CLK_{in}$ is obtained from the clock generating circuit 100. The clock obtained in this way is inputted to the phase lock circuit 101. The phase synchronizing circuit 101 starts the phase locking operation between the clock $CLK_{in}$ already inputted thereto and the clock inputted from the clock generating circuit 100, thereby synchronizing the phase of the clock generated by the clock generating circuit 100 with that of the clock $CLK_{in}$.

The output clock of the phase synchronizing circuit 101 is inputted to the waveform shaping circuit 102 so that the waveform of the clock is shaped so as to be protected from a possible deformation due to variations in the clock driving load. The waveform-shaped clock is inputted to the phase synchronizing circuit 101 which synchronizes the phase of the waveform-shaped clock with that of the clock $CLK_{in}$. In this way, a clock having a frequency which is an integral multiple of that of the clock $CLK_{in}$, becoming synchronized with the clock $CLK_{in}$ and having a shaped waveform is generated by the waveform shaping circuit 102.

Embodiment 8

Figure 32:
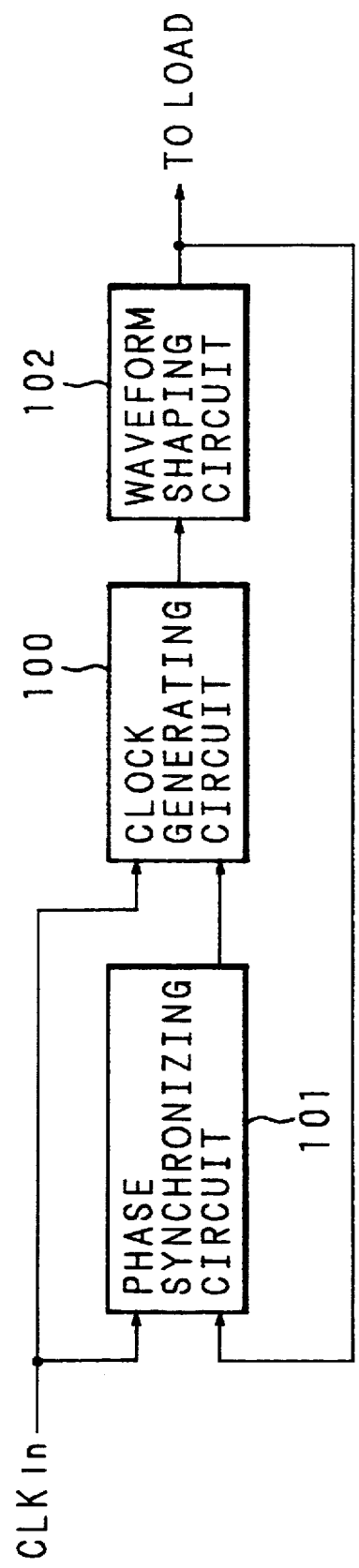
FIG. 32 is a block diagram showing the PLL circuit according to Embodiment 8.

FIG. 32 is a block diagram showing the PLL circuit as Embodiment 8 according to the present invention. The output clock of a phase synchronizing circuit 101 is inputted to a clock generating circuit 100. The output clock of the clock generating circuit 100 is inputted to a waveform shaping circuit 102. The output clock of the waveform shaping circuit 102 is inputted to the phase synchronizing circuit 101. A clock $CLK_{in}$ whose frequency is to be multiplied is inputted to the phase synchronizing circuit 101 and the clock generating circuit 100. The phase synchronizing circuit 101, the clock generating circuit 100 and the waveform shaping circuit 102 have the same structure as that of the respective phase lock circuit 101, the clock generating circuit 100 and the waveform shaping circuit 102 shown in FIG. 31.

In this PLL circuit, when the clock $CLK_{in}$ is inputted to the clock generating circuit 100, the clock generating circuit 100 generates a clock having a frequency obtained by multiplying the frequency of the clock $CLK_{in}$, and feeds it to the waveform shaping circuit 102 where the waveform of the clock is shaped. The phase synchronizing circuit 101 corrects any phase shift occurring in the clock generating circuit 100 and the waveform shaping circuit 102. In this way the waveform shaping circuit 102 outputs a clock having a multiplied frequency and becoming synchronized with the clock $CLK_{in}$.

Either of the clock generating circuit 100 of FIG. 4 using the delay line shown in FIG. 6 or the clock generating circuit shown in FIGS. 9, 20, 23, or 26.

The number of the delay lines and delay units referred to throughout Embodiments 1 to 8 is for illustration purpose only, and the present invention is not limited to it.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A circuit for generating a clock having a multiplied frequency, comprising:

a plurality of delay lines connected in cascade to which a first clock is to be inputted;

logic circuits to which the first clock and a second clock outputted from each of the delay lines are to be inputted, the logic circuits being alternately connected in cascade to the delay lines;

a frequency comparing circuit to which the outputs from each of said logic circuits are to be inputted;

a phase comparator to which the first clock and the second clock outputted from the delay line in the last stage are to be inputted; and a control circuit for controlling the delay time of the delay lines on the basis of an output signal of the phase comparator, wherein the control circuit controls the delay time of the delay lines on the basis of an output signal of the phase comparator when the output signal of the frequency comparing circuit is at a predetermined logic level.

2. A circuit for generating a clock having a multiplied frequency, comprising:

a plurality of delay lines connected in cascade to which a first clock is to be inputted; and a logic circuit unit to which the first clock and a second clock outputted from each of the delay lines are to be inputted, wherein each of the delay lines includes a first delay line section and a second delay line section, and each of the delay lines generates maximum delay time $(M \times T1)+(N \times T2)$ in the time resolution T2 on condition that $(N+1) \times T2 \geq T1$ and $T2 < T1$ where each of the first and the second delay line sections is controlled by an independent delay time selecting signal;

each of the first and the second delay line sections includes a plurality of delay units;

each and every delay unit of the first delay line section has an inherent delay time T1;

each and every delay unit of the second delay line section has an inherent delay time T2; and the first delay line section includes M-number of the delay units and the second delay line section includes N-number of the delay units.

3. A circuit for generating a clock having a multiplied frequency, comprising:

a plurality of delay lines connected in cascade to which a first clock is to be inputted;

a logic circuit unit to which the first clock and a second clock outputted from each of the delay lines are to be inputted;

a first phase comparator and a second phase comparator to which the first clock and the second clock outputted from the delay line in the last stage are to be inputted;

a first control circuit for controlling the delay time of a first delay line section on the basis of an output signal of the first phase comparator;

a second control circuit for controlling the delay time of a second delay line section on the basis of an output signal of the second phase comparator; and a lock detecting circuit for detecting a lock condition of a clock on the basis of the output signal of the first phase comparator, and controlling the let-in and shut-out of the output signals of the second phase comparator and the second control circuit, wherein each of the delay lines includes the first delay line section and the second delay line section, each of the first and second delay line sections includes a plurality of delay units connected in cascade, and the delay times of the delay units in the first and second delay line sections are differentiated from each other.

4. A PLL circuit for synchronizing the phases of clocks, comprising:

a clock generating circuit of claim 3;

a phase synchronizing circuit to which an output clock of the clock generating circuit is to be inputted; and a waveform shaping circuit to which an output of the phase synchronizing circuit is to be inputted, wherein the first clock is to be inputted to the clock generating circuit and phase synchronizing circuit, and an output clock of the waveform shaping circuit is to be inputted to the phase synchronizing circuit.

5. A PPL circuit for synchronizing the phases of clocks, comprising:

a phase synchronizing circuit; and a clock generating circuit of claim 3 to which an output clock of the phase synchronizing circuit is to be inputted as said first clock.

6. A semiconductor device including the clock generating circuit of claim 3.

7. A method for designing a clock generating circuit for generating a clock having a multiplied frequency, comprising steps of:

setting a lower limit of a frequency $F_{ref}$ of a clock whose frequency is to be multiplied;

determining a multiplication number N;

selecting a minimum value $T_{dmin}$ of a delay time proper to a delay unit constituting a delay line;

determining a minimum delay time $T_{mul}$ to be introduced by the delay line; and calculating the number K of delay units connectable in cascade for constructing one delay line on the basis of the following equation:

$$K \geq [\{1/(2 \cdot N \cdot F_{ref})\} - (T_{mul})]/(T_{dmin}).$$

8. A process for manufacturing a clock generating circuit, comprising steps of:

connecting the number K of delay units in cascade so as to construct a delay line;

$$K \geq [\{1/(2 \cdot N \cdot F_{ref})\} - (T_{mul})]/(T_{dmin})$$

where $F_{ref}$: a lower limit of the frequency of a clock whose frequency is to be multiplied N: a frequency multiplication number $T_{dmin}$: a minimum value of a delay time proper to the delay unit $T_{mul}$: a minimum delay time of the delay line connecting the plurality of delay lines in cascade; and connecting an output terminal of each of the delay lines to a logic circuit.

9. A circuit for generating a clock having a multiplied frequency, said circuit comprising:

a first delay line arranged to receive a first clock signal and generating a delayed first clock signal;

a first logic circuit arranged to receive said first clock signal and said delayed first clock signal and generating a second clock signal;

a second delay line arranged to receive said second clock signal and generating a delayed second clock signal; and a second logic circuit arranged to receive said first clock signal and said delayed second clock signal and generating a third clock signal, wherein each of the first and second delay lines includes a plurality of delay units connected in cascade, each of which has two switching elements for letting in or shutting out a clock, and a delay element connected to both of the switching elements.

10. The clock generating circuit according to claim 9, wherein each of the delay lines includes a selecting means for selecting one of the delay units so as to input the first clock to one of the switching elements of the selected delay unit.

* * * * *